(12) United States Patent
Iyer

(10) Patent No.: US 7,243,087 B2
(45) Date of Patent: Jul. 10, 2007

(54) METHOD AND APPARATUS FOR SOLVING BIT-SLICE OPERATORS

(75) Inventor: Mahesh Anantharaman Iyer, Sunnyvale, CA (US)

(73) Assignee: Synopsys, Inc., Mountain View, CA (US)

( * ) Notice: Subject to any disclaimer, the term of this patent is extended or adjusted under 35 U.S.C. 154(b) by 73 days.

(21) Appl. No.: 10/666,964

(22) Filed: Sep. 17, 2003

(65) Prior Publication Data
US 2005/0039077 A1 Feb. 17, 2005

Related U.S. Application Data

(63) Continuation of application No. 10/641,845, filed on Aug. 16, 2003.

(51) Int. Cl.
*G06F 17/00* (2006.01)
*G06N 5/02* (2006.01)

(52) U.S. Cl. .............................. 706/46; 706/12; 706/14

(58) Field of Classification Search ................... 706/12, 706/14, 46; 714/26
See application file for complete search history.

(56) References Cited

U.S. PATENT DOCUMENTS

| | | | | |
|---|---|---|---|---|
| 5,726,902 | A * | 3/1998 | Mahmood et al. ............. | 716/6 |
| 5,987,443 | A * | 11/1999 | Nichols et al. ............... | 706/11 |
| 6,175,946 | B1 * | 1/2001 | Ly et al. ........................ | 716/4 |
| 6,247,002 | B1 * | 6/2001 | Steels .......................... | 706/20 |
| 2003/0126104 | A1 * | 7/2003 | Evans-Beauchamp et al. . | 707/1 |
| 2004/0128388 | A1 * | 7/2004 | Kaiser ......................... | 709/227 |

OTHER PUBLICATIONS

A. Chandra, AVPGEN—A Test Generator for Architecture Verification, 1995, IEEE, 1063-8210/95, 188-200.*

A. Aharon, A. Bar-David, B. Dorfman, E. Gofman, M. Leibowitz, and V. Schwartzburd, "Verification of the IBM RISC System/6000 by a Dynamic Biased Pseudo-Random Test Program Generator", IBM Systems Journal, vol. 30, No. 4, 1991, pp. 527-538.

E. Bin, R. Emek, G. Shurek, and A. Ziv, "Using a Constraint Satisfaction Formulation and Solution Techniques for Random Test Program Generation", IBM Systems Journal, vol. 41, No. 3, 2002, pp. 386-400.

(Continued)

*Primary Examiner*—Joseph P Hirl
(74) *Attorney, Agent, or Firm*—Park, Vaughan & Fleming, LLP

(57) ABSTRACT

The following techniques for word-level networks are presented: constraints solving, case-based learning and bit-slice solving. Generation of a word-level network to model a constraints problem is presented. The networks utilized have assigned, to each node, a range of permissible values.

Constraints are solved using an implication process that explores the deductive consequences of the assigned range values.

The implication process may include the following techniques: forward or backward implication and case-based learning. Case-based learning includes recursive or global learning.

As part of a constraint-solving process, a random variable is limited to a single value. The limitation may be performed by iterative relaxation. An implication process is then performed. If a conflict results, the value causing the conflict is removed from the random variable by range splitting, and backtracking is performed by assigning another value to the random variable.

A procedure is provided for efficiently solving bit-slice operators.

8 Claims, 19 Drawing Sheets

OTHER PUBLICATIONS

A. K. Chandra and V.S. Iyengar, "Constrain Solving for Test Case Generation", Proceedings of International Conference on Computer Design, 1992, pp. 245-248.

A. K. Chandra, V. S. Iyengar, D. Jameson, R. Jawalakar, I. Nair, B. Rosen, M. Mullen, J. Yoon, R. Armoni, D. Geist, and Y. Wolfsthal, "AVPGEN—A Test Case Generator for Architecture Verification", IEEE Transactions on VLSI Systems, vol. 3, No. 2, Jun. 1995, pp. 188-200.

C.-Y. Huang and K.-T. Cheng, "Assertion Checking by Combined Word-level ATPG and Modular Arithmetic Constraint-Solving Techniques", Proceedings of the Design Automation Conference, Jun. 2000.

M. A. Iyer, "High Time for High-Level ATPG", Panel position statement, Proceedings of the International Test Conference, 1999, pp. 1112.

W. Kunz, and D. Pradhan, "Recursive Learning: a New Implication Technique for Efficient Solutions to CAD-problems—Test, Verification and Optimization", IEEE Transactions on Computer-Aided Design, vol. 13, No. 9, Sep. 1994, pp. 1143-1158.

I. Yuan, K. Shultz, C. Pixley, H. Miller, and A. Aziz, "Modeling Design Constraints and Biasing in Simulation Using BDDs", Proceedings of the International Conference on Computer-Aided Design, Nov. 1999, pp. 584-589.

* cited by examiner

Example Constraint Set Representation to
Illustrate Case-Based Learning

Example to Illustrate Static Implication
Cyclic Behavior

METHOD AND APPARATUS FOR SOLVING BIT-SLICE OPERATORS

This is a continuation, entitled to benefit under 35 U.S.C. 120, of the following U.S. Patent Application that is herein incorporated by reference:

"Method and Apparatus For Solving Constraints," filed on Aug. 16, 2003, having inventor Mahesh A. Iyer and U.S. Patent Office application Ser. No. 10/641,845.

CROSS REFERENCE TO RELATED APPLICATIONS

This application is related to the following U.S. patent application, that is herein incorporated by reference:

"Method and Apparatus For Case-Based Learning," filed on the same date as the present application, having inventor Mahesh A. Iyer and U.S. Patent Office Application No. to be determined.

1. Field of the Invention

The present invention relates generally to the solution of sets of constraints, and more particularly to the solution of sets of constraints in connection with the generation of random test data.

2. Background of the Invention

Random test data has a wide variety of uses. A particularly important application of random test data is in the verification of digital electronic circuits in order to exercise a wide variety of circuit paths for possible faults.

To tackle the increasing complexity of integrated digital electronic circuits, designers need faster and more accurate methods for verifying the functionality and timing of such circuits, particularly in light of the need for ever-shrinking product development times.

The complexity of designing such circuits is often handled by expressing the design in a high-level hardware description language (HLHDL). The HLHDL description is then converted into a physical circuit specification through processes, well known to those of ordinary skill in the art as "synthesis," involving translation and optimization. Examples of an HLHDL are:

1. IEEE Standard 1364-2001, for the Verilog Hardware Description Language. The Institute of Electrical and Electronics Engineers, Inc. 345 East 47$^{th}$ Street. New York; N.Y. 10017-2394 USA.
2. IEEE Standard 1076-1993, for the VHDL Hardware Description Language. ISBN: 1559373768, August 1994. The Institute of Electrical and Electronics Engineers, Inc., 345 East 47$^{th}$ Street, New York, N.Y. 10017-2394, USA.

An HLHDL description can be verified by simulating the HLHDL description itself, without translating the HLHDL to a lower-level implementation. This simulation is subjected to certain test data and the simulation's responses are recorded or analyzed.

Verification of the HLHDL description is important since detecting a circuit problem early prevents the expenditure of valuable designer time on achieving an efficient circuit implementation for a design which, at a higher level, will not achieve its intended purpose. In addition, simulation of the design under verification (DUV) can be accomplished much more quickly in an HLHDL than after the DUV has been translated into a lower-level, more circuit-oriented (e.g., gate-level) implementation.

The verification of HLHDL descriptions has been aided through the development of Hardware Verification Languages (or HVLs). An HVL can be implemented and supported by a test-bench automation (TBA) tool. Among other goals, HVLs are intended to provide programming constructs and capabilities which are more closely matched to the task of modeling the environment of an HLHDL design than are, for example, the HLHDL itself or software-oriented programming languages (such as C or C++). HVLs permit a DUV, particularly those DUVs expressed in an HLHDL, to be tested by stimulating certain inputs of the DUV and monitoring the resulting states of the DUV.

Most HVLs include a programming mechanism by which to specify constraints on a set of variables. Constraints have the advantage of permitting "legal" sets of inputs to a DUV (i.e., inputs to the DUV that simulate the DUV's environmental restrictions) to be specified in a declarative programming manner that is often easier to specify than, for example, a procedural approach. Such randomly selected solutions to these constraints can be used to provide stimulus to the DUV. Consequently, there is a need for an efficient constraints solving system for use with TBA tools.

A high-level view of this commonly used functional verification methodology is depicted in FIG. 1.

The high-level test bench is written in an HVL, that is supported by the underlying TBA tool, and has two main goals. First, the test bench seeks to apply random stimulus and/or directed tests to the DUV by interfacing to a simulator. Second, the test bench seeks to analyze results from the simulation by performing assertion checking and by measuring the functional coverage. Most designs have assumptions on how they interact with their environment. A goal of the test-bench is to generate random stimuli to the DUV that satisfy these environmental restrictions. Consequently, most commercial and industry-standard HVLs provide means to specify constraints on certain variables (that are declared within the test-bench) and the ability to randomize a certain set of these variables upon demand. The constraints themselves could be arbitrary expressions on signed or unsigned variables with varying bit-widths using the high-level operators supported by the HVL. The results of the randomization specified by the test-bench are translated (through procedural code within the test-bench) by the TBA tool into legal random stimuli to the DUV. When control is handed over to the simulator of the DUV, the effect of the newly-generated stimulus from the TBA tool is simulated until there are no more events for the simulator in the current clock cycle. At this point, control is handed back to the test-bench, which does assertion checking for the truth of certain properties (based on the current signal values of the DUV) and measures functional coverage (as defined by test-bench criteria). In addition, the test bench can receive feedback from the DUV, in the form of state variables (sv's), that it uses to adaptively adjust the course of its test generation. The constraints in the test-bench can also contain test-bench state variables (sv's). The test-bench, through the TBA tool, then generates the next set of random stimuli to the DUV, by finding a solution to the random variables of its constraints, given the current values for the sv's, and the process continues, until the test-bench finishes.

While constraints provide a powerful specification language, for such applications as design verification, finding an assignment to their variables that satisfies them can be complex. It is therefore desirable to have improved methods for finding solutions to a constraint or a set of constraints.

SUMMARY OF THE INVENTION

Summary of Problem and Representation

The present invention comprises the following types of techniques for word-level networks: combinational constraint expression solving, case-based learning and bit-slice solving.

The constraint expressions are parsed into a high-level constraint representation (i.e., the word-level network) upon which is operated a branch-and-bound algorithm that randomly selects solutions.

A constraint is any expression that evaluates to a Boolean value (i.e., either TRUE or FALSE).

The constraint solving problem comprises finding legal assignments to all random variables (or rv's) in V, given the particular values currently assigned to the state variables (or sv's in V, such that all the constraints in C are satisfied.

From an input set of constraints to be solved, a high-level representation, referred to herein as the "constraint set representation," is determined. The constraint set representation utilized by the present invention is a word-level network in which each operator, represented by a node, can propagate values that are not restricted to being just one or zero. The word-level nature of the networks addressed by the present invention permits it to more fully and efficiently explore the search space of a particular network than in prior approaches that focus upon single-bit-level networks.

The word-level networks addressed by the present invention can be in the form of a directed acyclic graph (DAG), with each high-level operator and operand (both constants and variables) of a constraint represented as a node.

In general, the term "justification" is used to refer to the process of determining legal values, without any uncertainty. When an input constraint set problem is satisfied by determining legal values to all random variables, all nodes in the constraint set representation are justified. The term "justified" is also defined below as it applies to Boolean nodes, with such nodes being called "justified Boolean nodes" or "unjustified Boolean nodes."

There is a node in the constraint set representation for each of the following: i) a leaf-level node for each operand to a constraint, including input variables and constants (variables that participate in multiple constraints have multiple fanouts in the constraint set representation); ii) a root-level node for the output (which is an AND node in the case of multiple constraints); and iii) a node for each operator of a constraint, located between the leaf nodes and the root-level node.

Each node of a constraint set representation is assigned a range of permissible values, indicated by a data structure referred to herein as a "range." A range is comprised of a set of one or more "intervals." An interval is a set of contiguous, monotonically increasing, integer values, defined (inclusively) by a low value and a high value.

For each operator of the HVL (in which the input constraint set to be solved is written), algorithms for implication (such implication process addressed in detail below) using the above-defined range data structure are implemented.

For some constraint set representations involving certain types of operators, were the implication process to be pursued completely, some of the ranges could result in containing an excessive number of intervals. Such excessive number of intervals is due to the absence of an "x" value that can compactly express certain repetitive "gaps" in the range associated with a node of the constraint set representation. An approach of the present invention, for reducing the number of intervals needed to represent such repetitive gaps, is to produce an over-approximated range (i.e., a range that may contain values that cannot be part of a solution to the input constraint set). While an over-approximated range is a potential problem, in terms of increasing the amount of searching that the present invention must do in order to find a solution, such increased search possibilities are managed by heuristic techniques (such as iterative relaxation), and efficient backtracking (with such techniques as interval splitting), described below.

Summary of Constraints Solving

A core sub-system of the present invention is a fast implication engine. In general, the implication engine explores implications: the extent to which a range at a node of the constraint set representation can be further limited as a deductive consequence of range values at other nodes of the constraint set representation.

The implication engine is referred to as an "implication process."

The constraints solving process begins by performing an implication process based upon the initial state of the constraint set representation. Such implication process may include any or all of the following techniques: forward implication, backward implication, and case based learning. These implication techniques are described in more detail below. If a conflict results from the implication process, then a solution to the input constraint set does not exist and a value of FAILURE is returned.

If the implication process does not end in failure, however, then all the random variables (rv's) of the constraint set representation that are not currently limited to a single value (referred to herein as an "available" rv), need to be identified such that, from among such available rv's, a current decision variable (dv) can be selected. Note that if there are no available rv's, then all the rv's have been limited to a single value and a solution to the input constraint set has been found. The finding of a solution to the input constraint set is indicated by the procedure returning SUCCESS. The selection of a current dv, from among the available rv's, can be accomplished according to a variety of different algorithms. A first approach is to select the current dv at random. A second approach is to compute a cost function, for each available rv, that is a metric of its desirability as a dv.

Once a current dv has been selected, the next step is to limit the range of the current dv to encompass a single value. Such range limitation of the dv may be performed gradually, using such techniques as iterative relaxation. Iterative relaxation is presented in more detail below.

Once a value has been selected for the current dv, implications are performed on the constraint set representation. This may include any or all of the following techniques: forward implication, backward implication, and case based learning.

If no conflict results from the implication process, then the procedure continues with picking the next current dv.

However, if a conflict does result from the implication process, the procedure will remove the value causing the conflict from the range of the current dv, by splitting the previous range value of the dv and doing an implication process to gain any implications resulting from the additional range splitting. A range is considered split if it has more than one interval. Also, in case of a conflict from the implication process, the procedure will backtrack by limiting the current dv to another single value of its range and performing the implication process once again. If, however, all the single values for the current dv have been exhausted, the procedure will next try backtracking to the previously current dv and try to limit that previously current dv to another single value of its range than had previously been settled upon. If, however, there is no previously current dv to backtrack to, then the procedure ends in FAILURE.

Further details of the basic constraint-solving process are presented below.

Summary of Implication Process

For each operator of the constraint specification language, algorithms are implemented to perform any or all of the following across its constraint representation node: forward and backward implications. For certain operators like Boolean nodes, algorithms are also implemented to perform case-based learning which, in general, lead to more implications.

In general, forward implication across an operator node is the process of determining a value range for that node's output using the value ranges of all its input nodes and the semantic functionality of that operator. For example, consider an adder with two 4-bit unsigned inputs that have value ranges {0:15} and {5:10}. The output of this adder is evaluated and represented in 5-bit precision with the value range {5:25}. Note that for many operators (for example Boolean, relational and unary reduction operators), the output node value range can be either {0:0}, {1:1}, or {0:1}.

In general, backward implication, to an input of an operator node, is the process of determining a range on that input using the ranges of other inputs of that operator node, the range of the output of that node and the semantic functionality of the operator.

Section 4.1 contains an example pseudo-code embodiment for top-level functionality of the implication engine. Section 4.2 contains an example pseudo-code embodiment for the discussed forward implication process, while Section 4.3 contains an example pseudo-code embodiment for the discussed backward implication process. Section 4.7 contains example pseudo-code that customizes the pseudo-code to specific operators.

Section 4.1 defines a procedure named "ImplyValuesInCircuitFe." The "Fe" of ImplyValuesInCircuitFe stands for "front end," and ImplyValuesInCircuitFe is an embodiment of an overall implication process that proceeds until the possible implications of a given constraint set representation has been converged upon.

ImplyValuesInCircuitFe calls the functions FowardImply and BackwardImply.

Section 4.2 defines a procedure named "ForwardImply."
Section 4.3 defines a procedure named "BackwardImply."
The pseudo-code of Section 4.7 is utilized, on an operator-specific basis, by ForwardImply and BackwardImply.

Summary of Case-Based Learning

Case-based learning explores implications using case-analysis on unjustified Boolean nodes. In general, the implication results on a variable node, for each case analyzed, are accumulated and the union represents the legal possible values for that variable.

The case-based learning technique described below is generally applicable to the annotation of word-level networks and is not limited to word-level networks as used for constraint set solving.

The Boolean nodes considered for case-based analysis are AND (&&) and OR (||).

The output of a Boolean node is said to have a controlling value if its range is {1:1} for an OR node and {0:0} for an AND node. The range of an input of an OR node is said to only contain values classified as controlling if its range only contains values that do not include {0:0}. The range of an input of an AND node is said to only contain values classified as controlling if its range only contains {0:0}. The range of an input of an AND node is said to only contain values classified as non-controlling if its range only contains values that do not include {0:0}. The range of an input of an OR node is said to only contain values classified as non-controlling if its range only contains {0:0}.

An unjustified Boolean node (or UBN) is a Boolean node whose output range has a controlling value ({1:1} for OR node and {0:0} for AND node) and the range of each input has both controlling and non-controlling values. A Boolean node that does not satisfy this definition of unjustified is classified as a justified Boolean node.

For an unjustified Boolean node, it is known that the output of the node has been put to a controlling value by at least one of the inputs, but it is not known which input or inputs will cause such controlling output value. Therefore, unjustified Boolean nodes can be subjected to case analysis, in which, one-by-one, each of the Boolean node's inputs is assumed to have a controlling value. The implications, resulting from such controlling value assumption, are explored.

Section 4.4 presents a pseudo-code description of the case-based learning technique.

The main case-based learning procedure of Section 4.4 is PerformLearningInCircuitFe. PerformLearningInCircuitFe iterates over each unjustified Boolean node (UBN) of the raceCircuit, referred to herein as the current UBN, and invokes the procedure PerformLearningInCircuit upon the current UBN. If the case-based learning succeeded in yielding additional information then an implication process is performed using ImplyValuesInCircuitFe.

The procedure PerformLearningInCircuit makes a distinction between what is called "recursive learning" and what is referred to as "global learning."

When the inputs to an unjustified Boolean node are each assumed to have a controlling value, and when such assumption leads to the input also being an unjustified Boolean node, then recursive learning is said to have occurred.

Global learning occurs when, as a result of the input constraint set, at least two nodes are unjustified. Assuming, for example, a constraint set representation in which there are two initial unjustified nodes "v" and "w," and that both node "v" and node "w" are explored for combinations of having an input with a controlling value, then global learning is said to be performed.

An overview of PerformLearningInCircuit, as it can operate once called by PerformLearningInCircuitFe, is as follows.

PerformLearningInCircuit iterates over each input to the current UBN passed to it by PerformLearningInCircuitFe, each such input referred to as the current UBN input. For each current UBN input, it is set to a controlling value and then RecursiveImplyDecisionValue is called. RecursiveImplyDecisionValue performs three sequential child invocations, which shall be referred to herein as phases. The second and third phases each comprise an invocation of RecursiveLearnAndImply followed by a recursive invocation of PerformLearningInCircuit. The recursive invocation of PerformLearningInCircuit for the second phase, and all child processes invoked as a result of it, complete before the third phase begins.

In the first phase, RecursiveImplyDecisionValue calls ImplyValuesInCircuitFe, an implication process that determines the implications, if any, of setting the current UBN input to a controlling value.

In the second phase, RecursiveImplyDecisionValue creates a list of the UBN's in the constraint set representation (the list referred to as unjustNodes), that excludes the current UBN but includes UBN's resulting from an invocation of PerformLearningInCircuit setting a current UBN input to a controlling value. RecursiveImplyDecisionValue then calls RecursiveLearnAndImply with unjustNodes as a parameter. RecursiveLearnAndImply iterates over each UBN of unjustNodes, recursively invoking PerformLearningInCircuit on each such node. Recursive learning occurs where a recursive invocation of PerformLearningInCircuit is applied to a node that became a UBN as a result of a controlling value being applied to a current UBN input by a prior invocation of PerformLearningInCircuit.

The third phase for RecursiveImplyDecisionValue is similar to the second phase. As in the second phase, an unjustNodes list is created. However, the unjustNodes list of the third phase includes all UBN's of the constraint set representation. Thus, the unjustNodes list of the third phase includes UBN's, other than the current UBN, that result from the input constraint set itself. RecursiveImplyDecisionValue then calls RecursiveLearnAndImply with unjustNodes as a parameter. RecursiveLearnAndImply iterates over each UBN of unjustNodes, recursively invoking PerformLearningInCircuit on each such node. Global learning occurs where the recursive invocation of PerformLearningInCircuit is applied to a node that is a UBN as a result of the input constraint set, independent of dynamic assumptions that have been made by invocations of PerformLearningInCircuit.

In general, as discussed above, the case-based learning technique described below is generally applicable to the annotation of word-level networks. Other applications in which the processing of word-level network can be optimized as a result of such annotation include the following: hardware design synthesis, automatic test pattern generation (ATPG), and formal circuit analysis.

Summary of Decision Variable Selection and Limitation

Embodiments of the invention pick from among the available primary-input random variables to select the current decision variable (dv). Even when user-defined variable priorities are supported by embodiments of the invention, there can still be multiple available variables at the same priority. In such a case, it may be preferable to determine a cost function to decide which variable to pick first for assignment.

Section 4.5 presents a pseudo-code procedure to compute a cost function.

Once a current dv has been picked, the next problem is to limit its range to a single value that can be part of a solution to the input constraint set. This can be accomplished as follows.

From the range of the current dv, an interval is randomly selected, that shall be referred to as the current interval.

If the cardinality of the current interval is sufficiently small, then a value from the interval can be selected at random. If the cardinality of the current interval is too large, the following iterative relaxation procedure can be used to reduce its cardinality before selection of a single value is performed.

First, the current interval is divided into a pre-determined number of smaller intervals. In some embodiments, the iterative relaxation procedure divides the current interval into two approximately equal-sized intervals. Then, iteratively, one of the smaller intervals is picked at random as the new current interval.

If the smaller intervals, available for selection as a new current interval, have been exhausted, then either iterative relaxation ends in failing to find an acceptable value, or it returns from the current recursion level. The return from the current recursion goes back to the step, of the higher level invocation, of iteratively selecting one of the smaller intervals such that another such smaller interval can be tried.

If, however, the smaller intervals, available for selection as a new current interval, have not been exhausted, then the iterative relaxation process continues by performing an implication process. The implication process finds any implications resulting from the limiting of the current interval to the new current interval. If a conflict results from such implication process, then it is known that, for the entire current interval, there is no valid single value that can be chosen. In this situation, one of the other smaller intervals is selected instead and the same process, of determining whether there are any valid values to be chosen in the new current interval, is repeated. If a conflict does not result from the implication process upon the new current interval, then the process recurses, with the current interval of the recursive invocation being the new current interval.

The recursive invocation begins with dividing the current interval (now the new current interval) into smaller intervals. Eventually, when the iterative relaxation search procedure has selected a current interval of sufficiently small size, a value of the current interval is randomly selected.

A pseudo-code procedure for iterative relaxation is depicted in Section 4.6.

Summary of Techniques to Handle Interval Cardinality and Bit Slice Operator

The implication algorithms of the implication process can be conservative, in the sense that when a compact range representation cannot be derived (either because of difficulties in crafting an algorithm for implication involving a particular operator or because the interval-cardinality of the resulting range would be too large), the implication process returns a broad range for the node, often limited only by the node's basic limitations of precision and sign. This approach is conservative since it only excludes those values from a range that have been definitely determined as not part of any solution to the input constraint set.

Note that while this approach sometimes leads to the retention of values known not to be part of a solution, such retention does not introduce serious performance issues, for many example input constraint sets, for at least the two following reasons. First, once a range is limited to a specific value, the constraint set representation is re-solved, through another application of the implication process, such that the selection of a value, which cannot be part of a solution, will be detected as introducing a conflict. Second, heuristic techniques, such as iterative relaxation, permit the present invention to efficiently handle ranges with large value-cardinality.

As with case-based learning described above, the backward implication bit-slice technique described below is generally applicable to the annotation of word-level networks and is not limited to word-level networks as used for constraint set solving.

For some operators backward implication is limited either because of algorithmic complexities or because of interval-cardinality explosion. For example, using a two-value data representation, it can be hard to perform backward implication across a bit slice operator. A bit-slice operator takes an input variable and selects, for output, the value of a range of bits of the input variable, where the range is specified by two other inputs to the bit-slice operator.

In the case of the bit-slice operator, and also in the case of the modulo operator example, interval-cardinality can be reduced through introduction of an unknown (or "x") value in a range's representation. Another approach, however, is performing a conservative backward implication during a typical implication process (e.g., the maximum range for "a" is intersected with the current range for "a"). However, when an implication process is begun, where the range for variable "a" is limited to encompass a single value, the value is selected such that it at least satisfies the bit-slice constraints, which minimizes the amount of backtracking performed in finding a solution to the input constraint set.

A procedure is described to efficiently support the determination of a value for a node, of a word-level network, that is an operand of several bit-slice operators. This procedure ensures that a range of values, evaluated for such an operand node, satisfies at least all the bit-slice operators for which it is an operand.

BRIEF DESCRIPTION OF THE DRAWINGS

The accompanying drawings, that are incorporated in and constitute a part of this specification, illustrate several embodiments of the invention and, together with the description, serve to explain the principles of the invention.

DETAILED DESCRIPTION OF PREFERRED EMBODIMENTS

Figure 1:
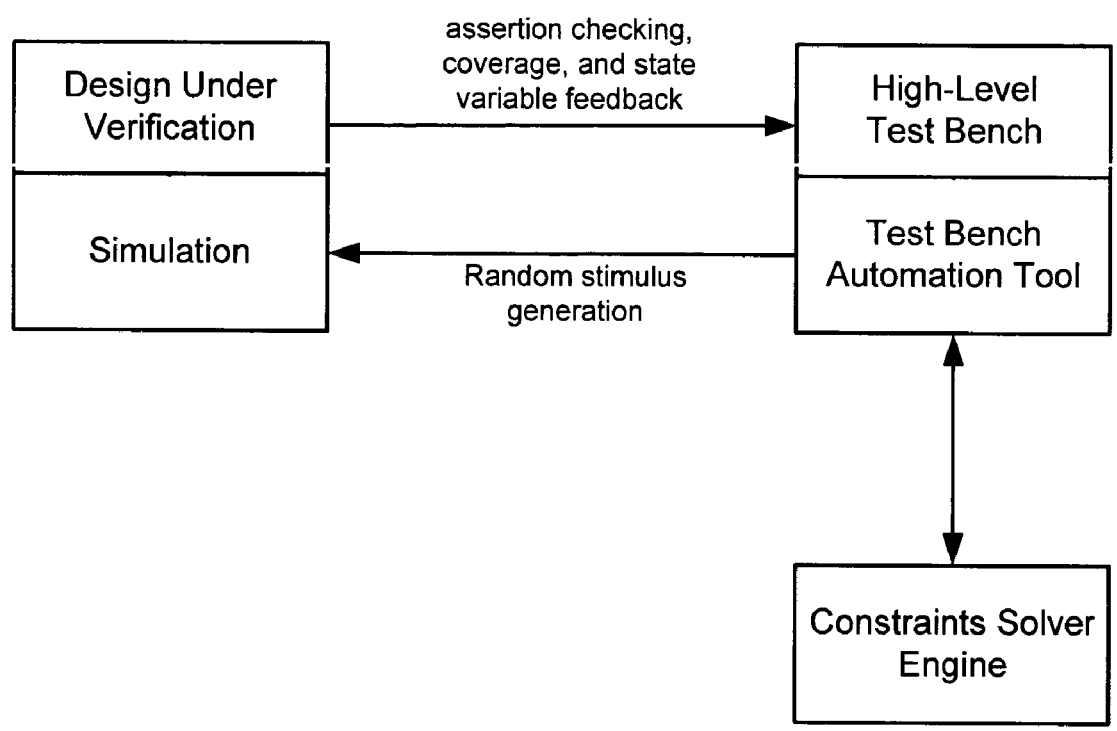
FIG. 1 depicts a high-level view of a commonly used functional verification methodology.

Reference will now be made in detail to preferred embodiments of the invention, examples of which are illustrated in the accompanying drawings. Wherever possible, the same reference numbers will be used throughout the drawings to refer to the same or like parts.

This specification contains pseudo-code to illustrate several embodiments of the invention and to explain its principles. The pseudo-code is loosely based upon the C and C++ programming languages. The C and C++ programming languages are described in such texts as "The C Programming Language", by B. W. Kernighan and D. M. Ritchie, Prentice Hall, Inc., 1988, ISBN 0-13-110362-8 (paperback), 0-13-110370-9 (hardback) and "The C++ Programming Language," by Bjarne Stroustrup, Addison-Wesley Pub. Co., 3rd edition, July 1997, ISBN 0-2018-8954-4, which are herein incorporated by reference.

Table of Contents to Detailed Description

1. Problem Formulation
2. Constraint Representation
3. Constraints Solving
3.1 Overview
3.2 Implication Process
3.2.1 Forward Implication
3.2.2 Backward Implication
3.2.3 Pseudo-Code
3.2.4 Case-Based Learning
3.3 Cost Function For Current Decision Variable Selection
3.4 Limiting Current DV To A Single Value: Iterative Relaxation
3.5 Backtracking And Gap Representation
3.6 Limiting The Interval-Cardinality Of A Range
3.6.1 Limited Backward Implication: Bit Slice Operator
3.6.2 Limited Backward Implication: Modulo Operator
3.7 Limiting The Implication Process: Cyclic Behavior
4. Pseudo-Code Listings
4.1 Top-level function for implication engine
4.2 Forward Implication
4.3 Backward Implication
4.4 Case-Based Learning
4.5 Cost Function For Decision Variable Selection
4.6 Iterative Relaxation
4.7 Operator-Specific Implication
4.7.1 Arithmetic Operators
4.7.2 Relational Operators
4.7.3 Boolean Operators
4.7.4 Unary Reduction Operators
4.7.5 Shift Operators
4.7.6 Concatenation Operators
4.7.7 Conditional Operator
4.7.8 Bit Slice Operator
5. HARDWARE ENVIRONMENT 1. Problem Formulation The present invention comprises techniques for solving combinational constraint expressions. The constraint expressions are parsed into a high-level constraint representation (i.e., a word-level network) upon which is operated a branch-and-bound algorithm that randomly selects solutions. In general, a decision to limit a random variable to fewer values corresponds to a branch decision, while the bound process makes sure that the implications of a branch decision are consistent with the constraints.

In addition, the present invention comprises techniques, that while useful for the solving of combinational constraint expressions, also have wider applicability to the annotation of word-level networks. These techniques include: case-based learning and the solving of multiple bit-slice operators.

The combinational constraints solving problem can be formulated as follows. Consider a set of variables, $V=\{v1, v2, \ldots, vn\}$, and a set of relations or constraints, $C=\{c1, c2, \ldots, cm\}$, such that each constraint is a relation between expressions over a subset of the variables in V. A constraint is any expression that evaluates to a Boolean value (i.e., either TRUE or FALSE). In this context, an expression is any legal sequence of variables and operators, as defined in the language used to express the constraints.

Each variable in V has a defined bit-width and sign that determine a range of values that can possibly be assigned to it. A variable in V can be random or state. A random variable (or rv) can be defined as taking on, at the appropriate point in the execution of an HVL program, a value that is randomly selected from its range, such that all the active constraints that the variable participates in are satisfied. A state variable (or sv) is similar to an "ordinary" programming language variable, i.e., it is a variable whose value is set by the various assignment constructs of the HVL. In addition to being a function of the HVL program itself, a state variable can also represent feedback from the DUV that is used by the HVL program to adapt the further course of testing.

The expressions of a constraint can employ a variety of operators, including arithmetic, Boolean, relational, unary reduction, bit-wise, shift, concatenation, bit slice, implication, and ternary multiplexing.

The constraint solving problem comprises finding legal assignments to all random variables (or rv's) in V, given the particular values currently assigned to the state variables (or sv's in V, such that all the constraints in C are satisfied.

Consider the following constraint solving problem, labeled Example 1, that is written in the OpenVera High Level Verification Language (also referred to herein as "Vera"), a product of Synopsys, Inc., Mountain View, Calif., USA:

EXAMPLE 1

```
rand bit[3:0] a, b;
rand integer c;
constraint c1 {
a + b = = c * 2;
}
constraint c2 {
c > 0;
}
```

Here "a" and "b" are 4-bit unsigned random variables and "c" is a 32-bit signed random variable. Thus, "a," "b," and "c" can possibly take, respectively, 16, 16 and $2^{32}$ values (the integer data type is assumed to be comprised of a 32 bit word). In the OpenVera language, c1 and c2 represent constraint blocks, with each block containing a constraint expression (or constraint). As can be seen, the constraint expression of block c1 is a declarative statement regarding a relationship that must be maintained over the variables "a," "b," "c," and the constant value of 2. The constraint expression of block c2 is a declarative statement regarding a relationship that must be maintained between the variable "c" and the constant value of zero. The constraint solving problem comprises finding values for "a," "b," and "c" that satisfies the declarative statements of blocks c1 and c2. Within an OpenVera program, since OpenVera is an object-oriented programming language, Example 1 is part of a class declaration from which instances are created. The constraint solving process can be invoked by applying a randomize method to an instance. One solution to the constraints of Example 1 is: a=1, b=3, c=2.

The resulting precision and sign, from expression evaluation, play an important role in solving a set of constraints. Different precision and sign semantics, for expression evaluation, can lead to different solution spaces for the same set of constraints. One approach, for example, is to use the IEEE Verilog Language model of precision and sign semantics in expression evaluation.

2. Constraint Representation

From an input set of constraints to be solved, a high-level representation, referred to herein as the "constraint set representation," is determined. The constraint set representation utilized by the present invention is a word-level network in which each operator, represented by a node, can propagate values that are not restricted to being just one or zero. The word-level nature of the networks addressed by the present invention permits it to more fully and efficiently explore the search space of a particular network than in prior approaches that focus upon single-bit-level networks.

The word-level networks addressed by the present invention can be in the form of a directed acyclic graph (DAG), with each high-level operator and operand (both constants and variables) of a constraint represented as a node.

Solving a set of constraints, as represented in the constraint set representation of the present invention, is essentially a word-level Satisfiability (SAT) problem.

The Boolean satisfiability problem for prepositional formulas in conjunctive normal form can be defined as follows. A Boolean variable $x_i$ is a variable that takes the value true or false (represented as 1 or 0, respectively). We call the value assignment of one variable a literal A clause is a disjunction of literals, e.g., $(x_1+\overline{x_2}+x_3)$. Given a set of clauses $C_1, C_2, \ldots, C_m$ and variables $x_1, x_2\ _{xn}$, the satisfiability problem is to determine if the formula $C_1 \cdot C_2 \cdot \ldots \cdot C_m$ is satisfiable, i.e., to determine whether an assignment of values to the variables exists so that the above formula is true. In the context of constraints solving, we extend this traditional notion of a SAT problem, such that the variables $x_1, x_2, \ldots x_n$ can take ranges of values, instead of just 0 or 1, and each clause can be any constraint expression as defined above.

Each constraint is independently modeled and all active constraints are solved for simultaneously. If the input constraint set contains more than one constraint, the DAG models of each constraint are conjoined using a root-level Boolean AND node. If the input constraint set comprises only one constraint, the root level node, of the constraint set representation, may not be an AND node. Regardless of the type of the root-level node, it has to be justified. For the present invention, justification refers to assigning values to the leaf-level nodes of the DAG, associated with the root-level node, such that a logic 1 value is produced on the root-level node. The justification is accomplished through the assignment of an appropriate value to all the random variables appearing in currently active constraints of the input constraint set. Typically, the present invention solves all the constraints simultaneously, as opposed to solving them in a pre-determined order. However, the present invention embraces an input constraint set that specifies an order of evaluation, either explicitly or implicitly.

In general, the term "justification" is used to refer to the process of determining legal values, without any uncertainty. When an input constraint set problem is satisfied by determining legal values to all random variables, all nodes in the constraint set representation are justified. The term "justified" is also defined below as it applies to Boolean nodes, with such nodes being called "justified Boolean nodes" or "unjustified Boolean nodes."

There is a node in the constraint set representation for each of the following: i) a leaf-level node for each operand to a constraint, including input variables and constants (variables that participate in multiple constraints have multiple fanouts in the constraint set representation); ii) a root-level node for the output (which is an AND node in the case of multiple constraints); and iii) a node for each operator of a constraint, located between the leaf nodes and the root-level node.

Each node of a constraint set representation is assigned a range of permissible values, indicated by a data structure referred to herein as a "range" (referred to in the pseudo-code herein as a "raceRange" object). A range is comprised of a set of one or more "intervals." An interval is a set of contiguous, monotonically increasing, integer values, defined (inclusively) by a low value and a high value. The intervals of a range are typically non-overlapping. A range may have more than one interval when they are needed to describe "gaps" in the set of values the range represents. The low and high values that define an interval are typically of the same data type. The data type, for the low value and the high value, determines the desired bit width of the interval and whether it is a signed value. The present invention is designed to include capacity for very large bit widths, e.g., widths of up to $2^{32}-1$ bits. Note that for purposes of illustration, ranges that contain only one interval may be depicted herein as a single set directly containing values, rather than as a set containing a single interval set.

For each operator of the HVL (in which the input constraint set to be solved is written), algorithms for implication (such implication process addressed in detail below) using the above-defined range data structure are implemented.

Some advantages of the range data representation are as follows.

It is suitable for set operations, like union and intersection. As will be discussed below, such set operations are often useful in the implication process.

Another advantage of the range representation is that it has no notion of an unknown, or "x," value. This simplifies the implication process because the same value representation is used for all the high-level operators, e.g., no distinction is made between datapath or control operators.

For some constraint set representations involving certain types of operators, were the implication process to be pursued completely, some of the ranges could result in containing an excessive number of intervals. Such excessive number of intervals is due to the absence of an "x" value that can compactly express certain repetitive "gaps" in the range associated with a node of the constraint set representation. An approach of the present invention, for reducing the number of intervals needed to represent such repetitive gaps, is to produce an over-approximated range (i.e., a range that may contain values that cannot be part of a solution to the input constraint set). While an over-approximated range is a potential problem, in terms of increasing the amount of searching that the present invention must do in order to find a solution, such increased search possibilities are managed by heuristic techniques (such as iterative relaxation), and efficient backtracking (with such techniques as interval splitting), described below.

Figure 2:
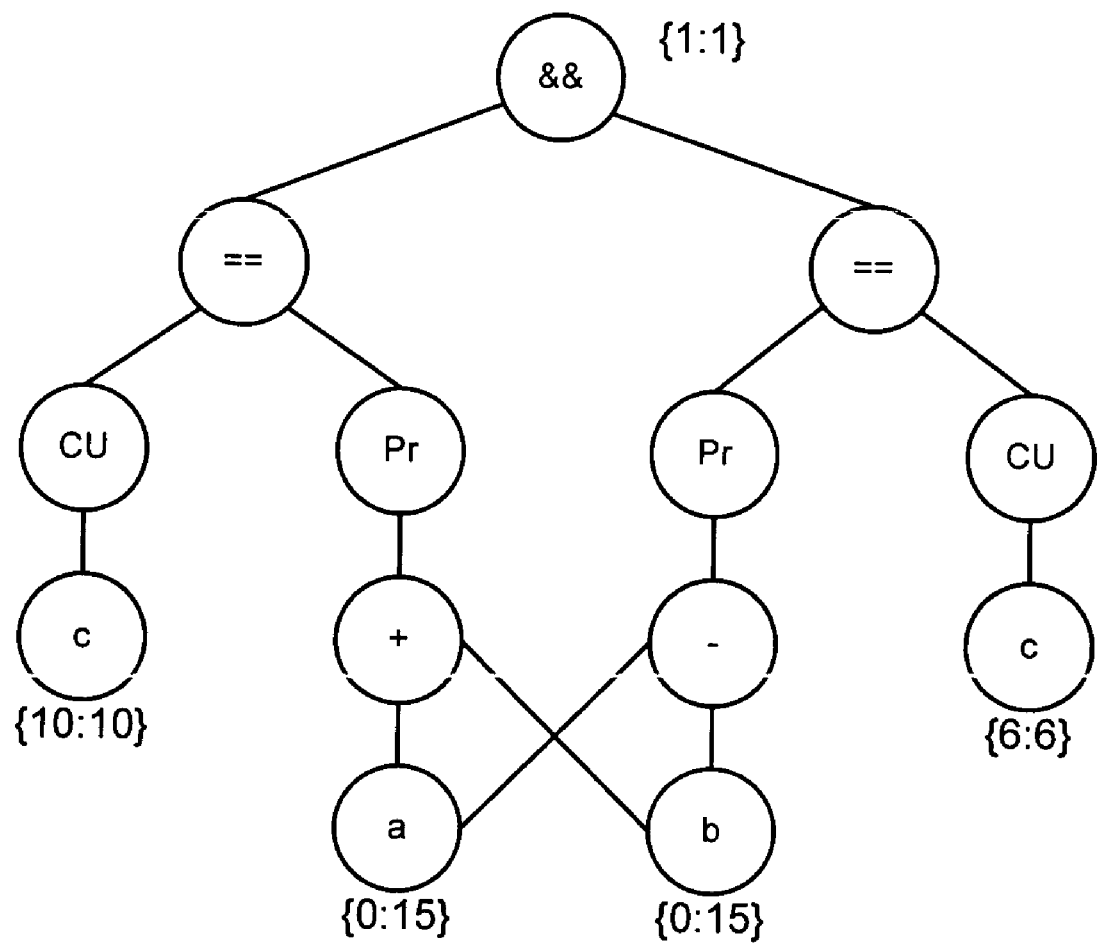
FIG. 2 depicts an example constraint set representation, with initial range assignments shown.

Yet another desirable property of the constraint set representation is that its size is linear in the size of the input constraint set to be solved. The constraint set representation is illustrated below. Consider the following set of input constraints, labeled Example 3, for which the resultant constraint set representation, along with initial values of the ranges, is shown in FIG. 2:

EXAMPLE 3

```
rand bit [3 : 0] a, b;
constraint c1 {
  a + b = = 10;
  a - b = = 6;
}
```

Example 3 (written in OpenVera), declares two random variables "a" and "b," each of which is four bits in width. The constraint block c1 contains two constraints, both of which must be satisfied.

For Example 3, the two constants, 10, and 6, are interpreted as 32-bit signed numbers. The results of the adder and the subtractor are initially unsigned and unbounded in precision due to the type of their operands. The results of the adder and subtractor are converted into 32-bit unsigned numbers using the Precision without wrap (Pr) operators on the outputs of the adder and subtractor. IEEE Verilog HDL interprets mixed signs on the equality operator (e.g., the 32-bit signed constants and 32-bit unsigned results of the adder and subtractor) as unsigned. This is modeled using the cast unsigned (CU) operator on the output of each constant node, that converts the 32-bit signed number of each constant into a 32-bit unsigned number.

As part of the model building process in the present invention, the primary input and primary output nodes of the constraint set representation are also initialized with value ranges. For example, the primary input node, a, is initialized with a range {0:15}. Similarly the output node is initialized with a range {1:1}, to model the constraint satisfiability problem.

3. Constraints Solving 3.1 Overview

A core sub-system of the present invention is a fast implication engine. In general, the implication engine explores implications: the extent to which a range at a node of the constraint set representation can be further limited as a deductive consequence of range values at other nodes of the constraint set representation. Towards this end, the implication engine manages such operations as node evaluation, scheduling and the extent to which implications are exhaustively explored. As part of the implication process, as performed by the implication engine, when a node evaluates to a new range as a result of an implication, the new range is intersected with the old range of the node. This ensures that results of an implication cannot reduce what is known about a range, since the range of values encompassed can either remain constant (if the latest implication adds no information) or decrease (if progress is made by the implication) in size as the implication process proceeds. If an intersection results in a range that is the empty set, an inconsistent state has been reached (also referred to as a conflict).

Figure 3:
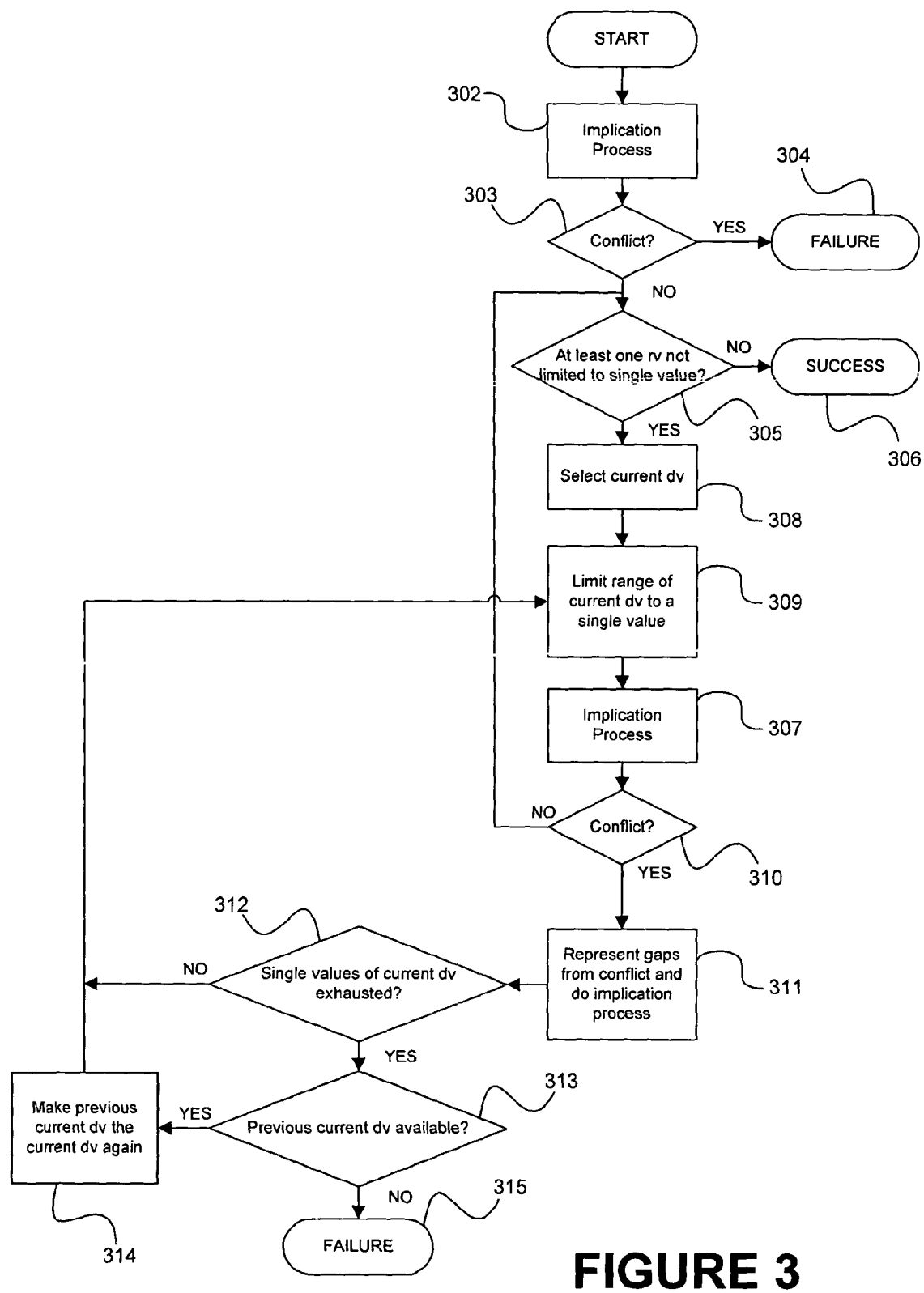
FIG. 3 depicts an overview of the overall semi-deterministic constraints solving process.

An overview of the basic constraints-solving process, that uses the implication engine, is shown in FIG. 3. The implication engine is referred to, in FIG. 3 and in the below description, as an "implication process."

The constraints solving process begins by performing an implication process (see step 302), based upon the initial state of the constraint set representation. The initial state of the constraint set representation comprises the following: the initial ranges of the constraint set representation and current values for the state variables. The initial ranges of the constraint set representation are determined by such factors as: the requirement of the root-level node being justified to {1:1}, constant values specified as part of the constraints themselves, and the initial range values for random variables (that are primary inputs to the constraint set representation) as determined by their precision and sign. Such implication process may include any or all of the following techniques: forward implication, backward implication, and case based learning. These implication techniques are described in more detail below. If a conflict results from the implication process ("yes" path of step 303 is taken), then a solution to the input constraint set does not exist and a value of FAILURE (see step 304) is returned.

If the implication process does not end in failure, however, then all the random variables (rv's) of the constraint set representation that are not currently limited to a single value (referred to herein as an "available" rv), need to be identified (see step 305) such that, from among such available rv's, a current decision variable (dv) can be selected. Note that if there are no available rv's, then all the rv's have been limited to a single value and a solution to the input constraint set has been found. The finding of a solution to the input constraint set is indicated in FIG. 3 by the procedure returning SUCCESS (see step 306), or similar suitable value indicating the same. The selection of a current dv (see step 308), from among the available rv's, can be accomplished according to a variety of different algorithms. A first approach is to select the current dv at random. A second approach is to compute a cost function, for each available rv, that is a metric of its desirability as a dv.

Once a current dv has been selected, the next step is to limit the range of the current dv to encompass a single value (see step 309). Such range limitation of the dv may be performed gradually, using such techniques as iterative relaxation. Iterative relaxation is presented in more detail below.

Once a value has been selected for the current dv, implications are performed on the constraint set representation (see step 307). This may include any or all of the following techniques: forward implication, backward implication, and case based learning.

If no conflict results from the implication process (the "no" path of step 310 is taken), then the procedure continues with picking the next current dv (at step 305).

However, if a conflict does result from the implication process (the "yes" path of step 310 is taken), the procedure will remove the value causing the conflict from the range of the current dv, by splitting the previous range value of the dv and doing an implication process to gain any implications resulting from the additional range splitting (see step 311). A range is considered split if it has more than one interval. For example, consider a range that has a single interval {0:15}. By removing the value {7:7} from this range, we get a split range {{0:6}, {8:15}}. The original range that had only one interval is now considered split because it has 2 intervals. Also, in case of a conflict from the implication process, the procedure will backtrack by limiting the current dv to another single value of its range and performing the implication process once again. If, however, all the single values for the current dv have been exhausted (see step 312), the procedure will next try backtracking to the previously current dv (see steps 313 and 314) and try to limit that previously current dv to another single value of its range than had previously been settled upon (see step 309). If, however, there is no previously current dv to backtrack to ("no" path of step 313 is taken), then the procedure ends in FAILURE (see step 315).

Further details of the basic constraint-solving process are presented below.

3.2 Implication Process

For each operator of the constraint specification language, algorithms are implemented to perform any or all of the following across its constraint representation node: forward and backward implications. For certain operators like Boolean nodes, algorithms are also implemented to perform case-based learning which, in general, lead to more implications. While the basic framework of the implication process is comprised of the forward and backward techniques, described below, heuristic approaches, such as case-based learning (also discussed below), can also make important contributions to limiting the search space.

3.2.1 Forward Implication

In general, forward implication across an operator node is the process of determining a value range for that node's output using the value ranges of all its input nodes and the semantic functionality of that operator. Such forward implication can be done using unbounded precision. For example, consider an adder with two 4-bit unsigned inputs that have value ranges {0:15} and {5:10}. The output of this adder is evaluated and represented in 5-bit precision with the value range {5:25}. Note that for many operators (for example Boolean, relational and unary reduction operators), the output node value range can be either {0:0}, {1:1}, or {0:1}. For signed or unsigned semantics, these ranges can be represented in 2 bits of storage. For example, if we are forward evaluating a less-than comparator, where the two input ranges are {{0:3}, {5:6}} and {9:12}, respectively, the result would he {1:1}. On the other hand if the second range value was {6:12} instead of {9:12}, the result would be {0:1}.

3.2.2 Backward Implication

In general, backward implication, to an input of an operator node, is the process of determining a range on that input using the ranges of other inputs of that operator node, the range of the output of that node and the semantic functionality of the operator. To illustrate a simple case of backward implication, consider a comparator node "c" (an operator node is identified herein, for purposes of illustration, with its output signal), that evaluates a<b, where a and b are 4-bit unsigned inputs to the comparator. Assume that c={1:1}, a={0:15}, and b={0:15}. A backward evaluation to node "a" implies that a={0:14}. Similarly, a backward evaluation to node "b"implies that b={1:15}.

3.2.3 Pseudo-Code

Section 4.1 contains an example pseudo-code embodiment for top-level functionality of the implication engine as discussed in Overview Section 3.1. Section 4.2 contains an example pseudo-code embodiment for the general forward implication process of Section 3.2.1, while Section 4.3 contains an example pseudo-code embodiment for the general backward implication process of Section 3.2.2. Section 4.7 contains example pseudo-code that customizes the general pseudo-code of Sections 4.2 and 4.3 to specific operators.

The term "race" is used as a root word for many of the variable and function names of the pseudo-code contained herein. This term is used to refer generally to the present invention, and is an acronym of the following phrase "RACE (Random ATPG for solving Constraint Expressions)." The RACE acronym reflects a view of the present invention as based upon adapting ATPG (Automatic Test Pattern Generation) techniques to the finding of randomly distributed solutions to constraint expressions.

Scheduling optimizations, that may be used in conjunction with the pseudo-code, include the following. Backward implication may only be performed on some inputs of a node. For example, consider a node with 2 inputs, called "a" and "b," and an output called "c." If input "a" gets a new value that causes a forward implication where output "c" obtains a new value, then output "c" is only backward implicated to input "b." Input "a" is skipped for backward implication because it would not reveal new information.

The pseudo-code of Section 4.1 operates as follows. Section 4.1 defines a procedure named "ImplyValuesInCircuitFe," that has parameters "impVals," and "nodesImplied." The "Fe" of ImplyValuesInCircuitFe stands for "front end," and ImplyValuesInCircuitFe is an embodiment of an overall implication process that proceeds until the possible implications of a given constraint set representation has been converged upon. The parameter "impVals" is a list of pairs of a node and its range. The impVals list represents those nodes that the implication process is directed to use as the basis of its implications. The parameter "nodesimplied" is a list of nodes whose ranges were changed as a result of the implication process of ImplyValuesInCircuitFe.

When ImplyValuesInCircuitFe is used to perform the implication process (labeled 302) of FIG. 3 that immediately follows START, the value of impVals can be each leaf node, and the root node, of the constraint set representation.

When ImplyValuesInCircuitFe is used to perform the implication process (labeled 307) of FIG. 3 that follows the limitation of the current dv to a single value, the value of impVals can be a single pair of the current dv node and its selected range value.

ImplyValuesInCircuitFe calls the functions FowardImply (Section 4.2) and BackwardImply (Section 4.3).

The pseudo-code of Section 4.2 operates as follows. Section 4.2 defines a procedure named "FowardImply," that has parameters "forwardQueues," "backwardQueues," and "nodesImplied." The parameter "forwardQueues" contains levelized queues of nodes in the constraint set representation that are to be subject to forward implication. Similarly, the parameter "backwardQueues" contains levelized queues of nodes in the constraint set representation that are to be subject to backward implication. Note that backwardQueues, with respect to ForwardImply, is acting as an output parameter that is input to BackwardImply for backward implication. As with ImplyValuesInCircuitFe, the parameter "nodesImplied" is a list of nodes whose ranges were changed as a result of the implication process of ForwardImply.

Levels, for the purpose of the levelized queues, can be defined as follows for the constraint set representation. All the leaf nodes are assigned an initial level, such as zero. In the example of FIG. 2, from left to right, the following leaf nodes are assigned value zero: 10, "a," "b," and 6. The parent nodes of each leaf node is identified. In the example of FIG. 2, from left to right, these are: CU, +, −, and CU. Each parent of a leaf node is assigned a level that is one greater than the greatest level of any of its children. In the example of FIG. 2, all of the parent nodes are assigned the level of one. The levelization process then finds the parents of all the level one nodes. In the example of FIG. 2, from left to right, these are: ==, Pr, Pr, and ==. Each parent of a level one node is assigned a level one greater than the greatest level of any of its children, so long as all of its children have already been assigned a level. In the case of the two "==" nodes, each has a Pr node child that has not already been assigned a level and so these two nodes are not assigned a level. The two Pr nodes themselves, however, are each assigned a level of two. The levelization process continues in a likewise manner, where the next step is finding the parents of the two Pr nodes of level two. The levelization process continues to move up the constraint set representation until the root node has been assigned a level. For the example of FIG. 2, the end result of the levelization process is as follows:

Level 0 nodes: 10, a, b, 6
Level 1 nodes: CU, +, −, CU
Level 2 nodes: Pr, Pr
Level 3 nodes: ==, ==
Level 4 nodes: &&

The pseudo-code of Section 4.3 operates as follows. Section 4.3 defines a procedure named "BackwardImply," that has parameters "forwardQueues," "backwardQueues," and "nodesImplied." The parameter "backwardQueues" contains levelized queues of nodes in the constraint set representation that are to be subject to backward implication. Similarly, the parameter "forwardQueues" contains levelized queues of nodes in the constraint set representation that are to be subject to forward implication. Note that forwardQueues, with respect to BackwardImply, is acting as an output parameter that is input to ForwardImply for forward implication. As with ForwardImply, the parameter "nodesimplied" is a list of nodes whose ranges were changed as a result of the implication process of BackwardImply.

The pseudo-code of Section 4.7 operates as follows. The pseudo-code of Section 4.7 is utilized, on an operator-specific basis, by ForwardImply and BackwardImply. Specifically, the pseudo-code of Section 4.7 is invoked in ForwardImply by the line labeled 2.a that reads as follows:

newValue=forward evaluate node

The pseudo-code of Section 4.7 is invoked in BackwardImply by the line labeled 2.a.i.1 that reads as follows:

newValue=backward evaluate to input_node

The pseudo-code of Section 4.7 is written on an interval basis, while the lines 2.a of ForwardImply and 2.a.i.1 of BackwardImply are passing whole ranges of the node to be implied. Therefore, between the calls of lines 2.a of ForwardImply and 2.a.i.1 of BackwardImply, and the interval-basis pseudo-code of Section 4.7, is additional code that generates cross-product combinations of intervals for the node to be implied. Each such cross-product combination is processed by the appropriate forward or backward implication pseudo-code of Section 4.7, and the results of all the cross-products are combined to produce the final result for lines 2.a of ForwardImply and 2.a.i.1 of BackwardImply.

For example, consider an AND node, with inputs "a" and "b," that is to be forward evaluated by line 2.a of ForwardImply. If the range of input "a" has two intervals, while the range for input "b" has three intervals, the number of cross-product combinations of intervals, each of which is to be processed by the "&&" operator pseudo-code of Section 4.7.3.1, is two times three or six.

3.2.4 Case-Based Learning

Case-based learning explores implications using case-analysis on unjustified Boolean nodes. In general, the implication results on a variable node, for each case analyzed, are accumulated and the union represents the legal possible values for that variable.

The case-based learning technique described below is generally applicable to the annotation of word-level networks and is not limited to word-level networks as used for constraint set solving. Once the case-based learning technique has been presented below with respect to constraint set solving, other example applications of the technique are discussed.

3.2.4.1 Unjustified Boolean Nodes

The Boolean nodes considered for case-based analysis are AND (&&) and OR (||). Without loss of generality, the description below assumes that the Boolean nodes to be analyzed have two inputs. In the absence of known or assumed constraints, the possible output values that a Boolean node can have are expressed by the intervals: {0:0}, {1:1} and {0:1}. The values that the inputs of a Boolean node can have depend on the following factors: i) the precision and sign of the Boolean node's input nodes, which determine the maximum range that the node can have, and ii) constraints upon the Boolean node's input nodes.

The output of a Boolean node is said to have a controlling value if its range is {1:1} for an OR node and {0:0} for an AND node. The range of an input of an OR node is said to only contain values classified as controlling if its range only contains values that do not include {0:0}. The range of an input of an AND node is said to only contain values classified as controlling if its range only contains {0:0}. The range of an input of an AND node is said to only contain values classified as non-controlling if its range only contains values that do not include {0:0}. The range of an input of an OR node is said to only contain values classified as non-controlling if its range only contains {0:0}.

In the absence of known constraints for its output, if both inputs of a Boolean node have ranges that contain both controlling and non-controlling values, then forward implication applied to such a Boolean node will result in the {0:1} range on its output.

An unjustified Boolean node (or UBN) is a Boolean node whose output range has a controlling value ({1:1} for OR node and {0:0} for AND node) and the range of each input has both controlling and non-controlling values. A Boolean node that does not satisfy this definition of unjustified is classified as a justified Boolean node.

For an unjustified Boolean node, it is known that the output of the node has been put to a controlling value by at least one of the inputs, but it is not known which input or inputs will cause such controlling output value. Therefore, unjustified Boolean nodes can be subjected to case analysis, in which, one-by-one, each of the Boolean node's inputs is assumed to have a controlling value. The implications, resulting from such controlling value assumption, are explored.

As an example of how an OR node can be made to be justified or unjustified, consider an OR node whose output range is {1:1} and whose two inputs, "a" and "b," have the ranges of {0:15} and {0:31}, respectively. This is an example of an OR node where the ranges of both inputs contain both controlling and non-controlling values. This OR node is unjustified.

If the ranges for "a" and "b" are changed to, respectively, {12:15} and {0:7}, however, an example is produced in which only one of the ranges contains both controlling and non-controlling values (the range {0:7}), while the other range contains only controlling values (the range {12:15}). In this example, the OR node is no longer unjustified because forward implication on the node will result in the {1:1} range on its output that is consistent with the pre-existing range of the output.

If the ranges of "a" and "b" are changed to {0:0} and {0:7}, respectively, an example is produced in which only one of the ranges contains both controlling and non-controlling values (the range {0:7}), while the other range contains only non-controlling values (the range {0:0}). In this example, the OR node is also no longer unjustified for the following reason. A backward implication to input "b" will result in range {1:7} on input "b." A subsequent forward implication of the OR node, with the new ranges for "a" and "b," results in the range {1:1} on the output that is consistent with the current range of the output.

3.2.4.2 Overview of Case-based Learning

Section 4.4 presents a pseudo-code description of the case-based learning technique. With respect to the overall constraints-solving process of FIG. 3, the pseudo-code of Section 4.4 is intended for use in the implication process (see step 302) that immediately follows START. Within the implication process, the pseudo-code of Section 4.4 is intended for use after the forward and backward implications (as illustrated by the pseudo-code of Sections 4.2 and 4.3) have been performed. The pseudo-code of Section 4.4 can also be used, with the necessary changes, at other points within the overall constraints-solving process of FIG. 3. For example, the pseudo-code can be used in the implication process that follows the step that limits the range of the current dv to a single value (see step 307).

Figure 13A:
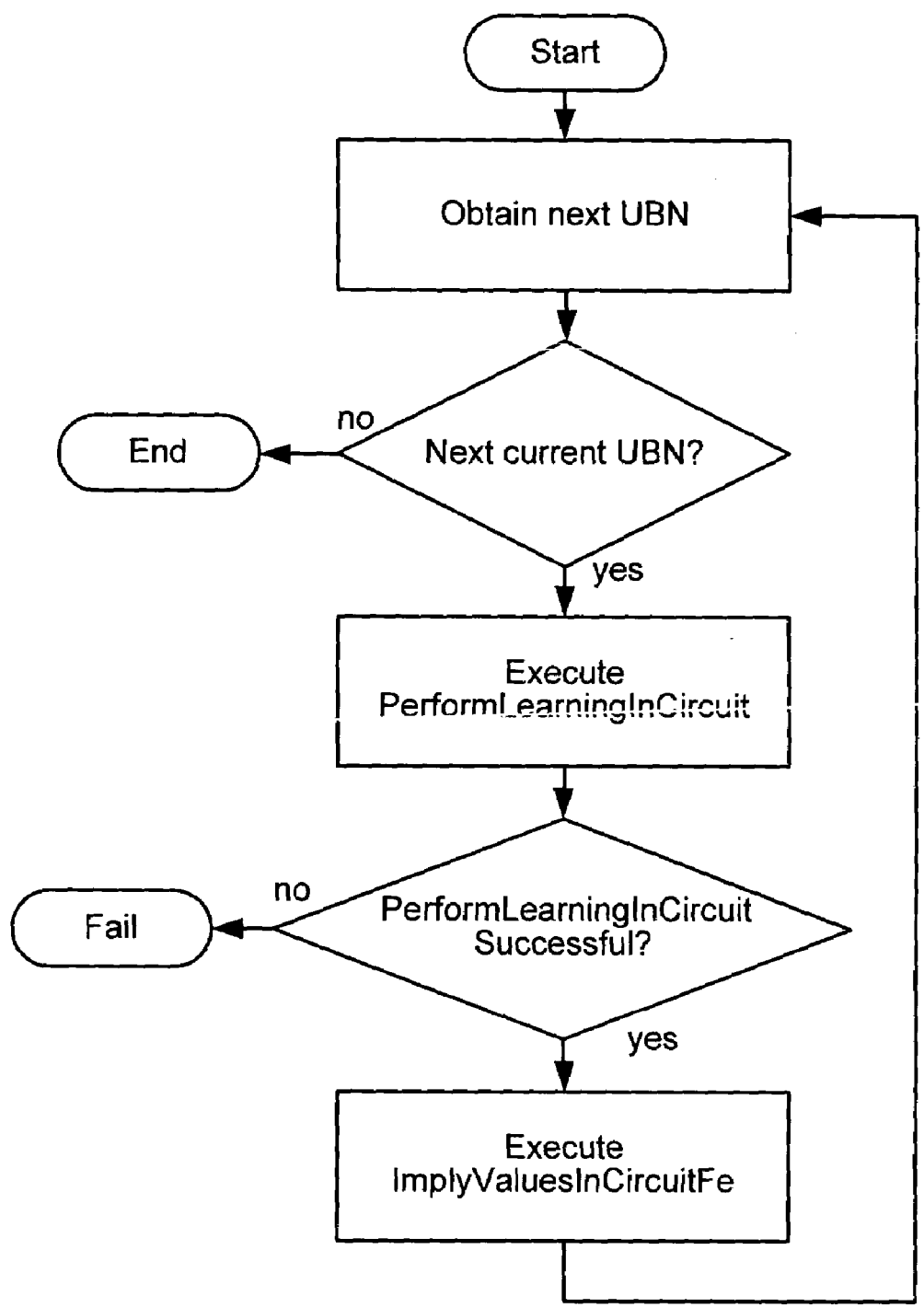
FIGS. 13A–13B depict processes for case-based learning.

The main case-based learning procedure of Section 4.4 is PerformLearningInCircuitFe, that takes as a parameter "raceCircuit" that is set to the constraint set representation to be processed. FIG. 13A graphically depicts an overview of PerformLearningInCircuitFe. PerformLearningInCircuitFe iterates over each unjustified Boolean node (UBN) of the raceCircuit, referred to herein as the current UBN, and invokes the procedure PerformLearningInCircuit (see step 1.b of PerformLearningInCircuitFe) upon the current UBN. If the case-based learning succeeded in yielding additional information ("retVal" is tested TRUE in step 1.c), then an implication process is performed using ImplyValuesInCircuitFe (see step 1.c.i that invokes ImplyValuesInCircuitFe).

Figure 4:
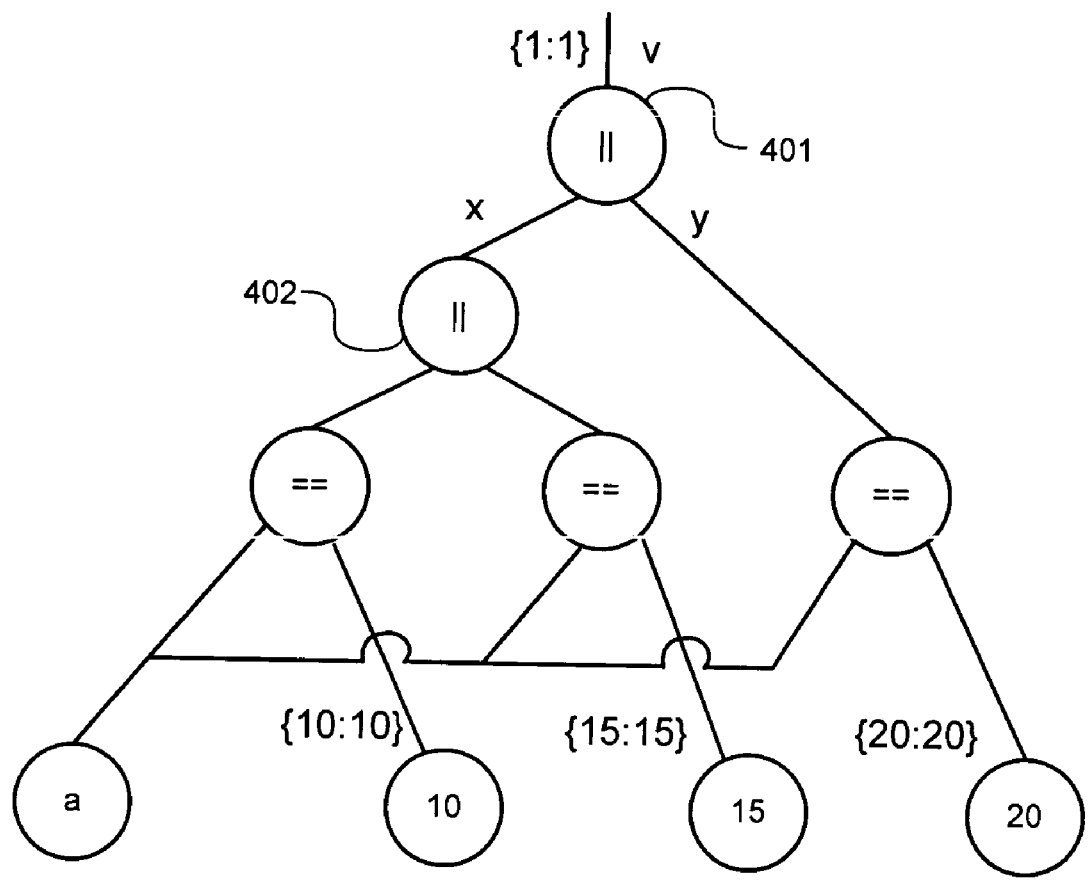
FIG. 4 depicts an example constraint set representation to illustrate case-based learning.

The case-based learning technique of PerformLearningInCircuit is described below in conjunction with the following example constraint set (written in OpenVera), labeled Example 6, whose constraint set representation is shown in FIG. 4:

EXAMPLE 6

```
rand bit[31 : 0] a;
constraint c1 {
  a = = 10 || a = = 15 || a = = 20;
}
```

In Example 6, "a" is declared to be a random variable with a width of 32 bits. Example 6 has a single constraint block, called c1, containing a single constraint.

Variable "a" of Example 6 begins with a range of {0: $2^{32}$–1}. Without case-based analysis, the range of "a" cannot be reduced from its initial $2^{32}$ values by the basic techniques of forward and backward implication as performed by ImplyValuesInCircuitFe. By using case-based analysis, it can be determined that node "a" can only take values 10, 15 or 20.

The OR node (labeled 401) with output "v" (or node "v") is an unjustified node. If the inputs to node "v" are assumed, from left to right, to each have a controlling value, then the OR node (labeled 402) with output "x" (or node "x") is first assumed to be an unjustified node. Recursively, case-based analysis is performed on node "x." If the inputs to node "x" are assumed, from left to right, to each have a controlling value, then the output of the "==" node, for the "==" operator that has variable "a" and 10 as inputs, is the first node to have its output assumed to be one. Such an assumption implies that the variable "a" is equal to ten. Stepping through all four combinations, of assuming a one on the inputs of either node "v" or node "x," it is determined that node "a" can only take values 10, 15 or 20.

The procedure PerformLearningInCircuit makes a distinction between what is called "recursive learning" and what is referred to as "global learning."

When the inputs to an unjustified Boolean node are each assumed to have a controlling value, and when such assumption leads to the input also being an unjustified Boolean node, then recursive learning is said to have occurred. In the above example of FIG. 4, recursive learning occurred when assuming that the node "x" input to node "v" is at a controlling value recursively implied that node "x" is also unjustified.

Global learning occurs when, as a result of the input constraint set, at least two nodes are unjustified. In the example of FIG. 4, only node "v" is initially unjustified. If we assume, however, an alternative constraint set representation in which there is another initial unjustified node "w," and that both node "v" and node "w" are explored for combinations of having an input with a controlling value, then global learning is said to be performed. To limit computational complexity of the global learning process, embodiments of the invention can use a heuristic to perform such global learning only on a subset of the remaining unjustified nodes that are within a small pre-defined number of levels of logic within the level of the original unjustified node on which recursive learning was invoked.

In addition to the above approaches to recursive and global learning, embodiments of the invention can use several additional heuristics to bound computation. These heuristics can track, from previous UBNs that were analyzed for recursive or global learning, such quantities as: the number of learned implications (i.e., implications that narrowed the set of possible solutions to the constraints), and the total number of implications that were performed to obtain the learned implications. Such quantities can be tracked on a per-UBN basis, or running totals can be kept. A percentage of learned implications can be determined from using both a number of learned implications value and a total number of implications performed value. All of these quantities (i.e., learned implications, total implications and percentage of learned implications) can be subject to a threshold test, whereby a currently analyzed UBN can be compared to previously analyzed UBNs. Using this approach, the recursive or global learning technique is adaptive in its ability to terminate if it determines the learning is not effective enough for a particular circuit.

Figure 13B:
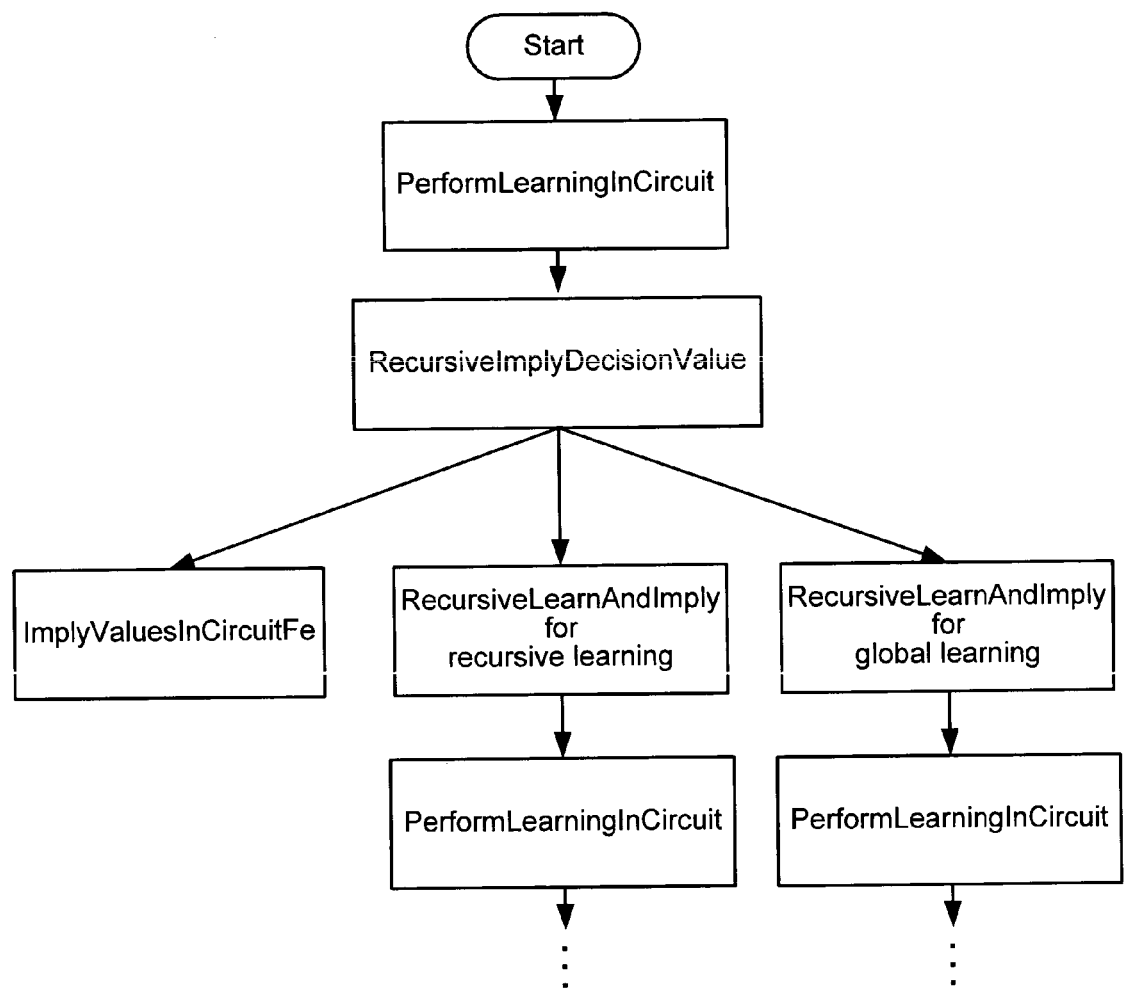

An overview of PerformLearningInCircuit, as it can operate once called by PerformLearningInCircuitFe of FIG. 13A, is depicted in FIG. 13B.

PerformLearningInCircuit iterates over each input to the current UBN passed to it by PerformLearningInCircuitFe, each such input referred to as the current UBN input. For each current UBN input, it is set to a controlling value and then RecursiveImplyDecisionValue is called. As can be seen in FIG. 13B, RecursiveImplyDecisionValue performs, from left to right, three sequential child invocations, which shall be referred to herein as phases. The second and third phases each comprise an invocation of RecursiveLearnAndImply followed by a recursive invocation of PerformLearningInCircuit. The recursive invocation of PerformLearningInCircuit for the second phase, and all child processes invoked as a result of it, complete before the third phase begins.

In the first phase, RecursiveImplyDecisionValue calls ImplyValuesInCircuitFe, an implication process that determines the implications, if any, of setting the current UBN input to a controlling value.

In the second phase, RecursiveImplyDecisionValue creates a list of the UBN's in the constraint set representation (the list referred to as unjustNodes), that excludes the current UBN but includes UBN's resulting from an invocation of PerformLearningInCircuit setting a current UBN input to a controlling value. RecursiveImplyDecisionValue then calls RecursiveLearnAndImply with unjustNodes as a parameter. RecursiveLearnAndImply iterates over each UBN of unjustNodes, recursively invoking PerformLearningInCircuit on each such node. Recursive learning occurs where a recursive invocation of PerformLearningInCircuit is applied to a node that became a UBN as a result of a controlling value being applied to a current UBN input by a prior invocation of PerformLearningInCircuit.

The third phase for RecursiveImplyDecisionValue is similar to the second phase. As in the second phase, an unjustNodes list is created. However, the unjustNodes list of the third phase includes all UBN's of the constraint set representation. Thus, the unjustNodes list of the third phase includes UBN's, other than the current UBN, that result from the input constraint set itself. RecursiveImplyDecisionValue then calls RecursiveLearnAndImply with unjustNodes as a parameter. RecursiveLearnAndImply iterates over each UBN of unjustNodes, recursively invoking PerformLearningInCircuit on each such node. Global learning occurs where the recursive invocation of PerformLearningInCircuit is applied to a node that is a UBN as a result of the input constraint set, independent of dynamic assumptions that have been made by invocations of PerformLearningInCircuit.

3.2.4.3 Detailed Discussion of Pseudo-code 3.2.4.3.1 PerformLearningInCircuit

Once PerformLearningInCircuitFe has focused upon the current UBN, PerformLearningInCircuit attempts to accomplish case-based learning from it.

PerformLearningInCircuit iterates over each input to the current UBN, referred to as the current UBN input (see pseudo-code line labeled 2).

A controlling value, called "sel_value," is generated for the current UBN input (see pseudo-code line labeled 2.a).

RecursiveImplyDecisionValue is then invoked to find the implications resulting from setting the current UBN input to sel_value (see pseudo-code line labeled 2.b). For the example of FIG. 4, if the "y" input is the current UBN input, then the setting of "y" to a value greater than zero will cause RecursiveImplyDecisionValue to learn that the variable "a" must then have a range {20:20} and this result is returned by RecursiveImplyDecisionValue in its nodesImplied parameter.

The result of performing RecursiveImplyDecisionValue is tested by the pseudo-code line labeled 2.c.

If RecursiveImplyDecisionValue failed, this indicates that a conflict resulted from the setting of the current UBN input to a controlling value. The failure of RecursiveImplyDecisionValue is indicated by "retVal" testing FALSE, causing the "else" of the pseudo-code line labeled 2.d is performed. If a conflict resulted, sel_value is excluded from the range of the current UBN input so that it will not be tried again. The controlling value itself is a range and can include all individual controlling values. For example, a controlling value for an OR gate is the range {1:15}, and if the implications of this value failed, it means that none of the values in range {1:15} are possible.

If RecursiveImplyDecisionValue succeeded, then the following is performed. First, a test is performed to determine whether the current UBN input is the first input of the current UBN to be processed by this particular invocation of PerformLearningInCircuit (see pseudo-code line labeled 2.c.i). If the result of this test is TRUE, then the implications just learned from invoking RecursiveImplyDecisionValue are always kept (see pseudo-code line labeled 2.c.i.1). If the current UBN input is not the first input of the current UBN to be processed, the implications just learned are unioned with the implications learned from the setting of the earlier-considered inputs of the current UBN to a controlling value (see "for" loop of pseudo-code labeled 2.c.ii.1).

Regardless of whether RecursiveImplyDecisionValue succeeded, once its results have been processed, the state of the constraint set representation (often referred to as "the circuit" in the pseudo-code) is restored to the state it was in before the pseudo-code step labeled 2.b such that the next input of the current UBN can be considered as the current UBN input (see pseudo-code line labeled 2.e).

Once all the inputs of the current UBN have been considered, the variable "failcount" is tested (see pseudo-code line labeled 3). For each input of the current UBN for which RecursiveImplyDecisionValue failed, failcount was incremented. In this pseudo-code, it is assumed that all UBNs have only two inputs.

If failCount equals two, it is known that setting either input of the current UBN to a controlling value resulted in a conflict. Thus failCount equaling two indicates a serious problem performing any case-based learning on the constraint set representation. In this case, any implications learned thus far from case-based learning are deleted (by the pseudo-code line labeled 4.a) and PerformLearningInCircuit returns a FALSE value (by the pseudo-code line labeled 4.b) to PerformLearningInCircuitFe. PerformLearningInCircuitFe receiving a FALSE value causes it to do no implication process upon the constraint set representation based upon case-based learning and PerformLearningInCircuitFe simply returns a failure value of FALSE. In essence, this represents a conflicting set of constraints that cannot all be satisfied simultaneously.

If failCount is less than two, then any case-based learning accomplished from the current UBN is accumulated in the learnedImps table (by the pseudo-code line labeled 3.a). Also, PerformLearningInCircuit returns a TRUE value (by the pseudo-code line labeled 3.b) to PerformLearningInCircuitFe. PerformLearningInCircuitFe receiving a TRUE value causes it to do an implication process upon the constraint set representation based upon case-based learning of the current UBN (i.e., ImplyValuesInCircuitFe is invoked by pseudo-code line labeled 1.c.i.

3.2.4.3.2 RecursiveImplyDecisionValue

RecursiveImplyDecisionValue's parameters include a constraint set representation (also called a raceCircuit or circuit), an input node that has been set to sel_value and a nodesImplied table that is to be populated. Discussion of RecursiveImplyDecisionValue is illustrated in this section by discussing it in conjunction with the example of FIG. 4, with the assumption that the input "x" has been set to a controlling value (e.g., {1:1}).

The implications learned by the present invocation of RecursiveImplyDecisionValue are kept in the impVals table. RecursiveImplyDecisionValue begins (in the pseudo-code line labeled 1) by storing the fact of "x" being set to a controlling value in the impVals table.

The implication engine ImplyValuesInCircuitFe is then invoked (by the pseudo-code line labeled 2), but the result of simply setting "x" to a controlling value does not yield any further results (for the example of FIG. 4) through forward or backward implication.

If the recursive learning depth tested for by RecursiveImplyDecisionValue (by the pseudo-code line labeled 3) is not exceeded, then the following case-based learning is accomplished.

A list of nodes, called unjustNodes, is created (by the pseudo-code line labeled 3.a) that lists nodes (like "x") that have been set to a controlling value by the case-based learning process.

While a list of nodes, such as unjustNodes, can be recursed upon according to variety of strategies, one approach (performed by the pseudo-code line labeled 3.b) is to sort such nodes in reverse levelized order. Such a sorting means that UBNs closer to the root of the constraint set representation are earlier on the list. RecursiveLearnAndImply is then invoked (by the pseudo-code line labeled 3.c) with the unjustNodes list passed as a parameter.

RecursiveLearnAndImply iterates over each UBN of unjustNodes (see pseudo-code line labeled 1) and recursively invokes PerformLearningInCircuit upon it (see pseudo-code line labeled 1.b). In the case of node "x" being set to a controlling value, the invocation of PerformLearningInCircuit by RecursiveLearnAndImply means that "x" itself is then treated as a UBN, and explored by case-based analysis, in the same manner as which "v" is explored when PerformLearningInCircuit is called by PerformLearningInCircuitFe. Such recursive exploration of "x" is an example of recursive learning.

Once the call to RecursiveLearnAndImply by RecursiveImplyDecisionValue has been completed, a fuller consideration of the constraint set representation's UBNs is performed (by the pseudo-code line labeled 3.d). In particular, a list of UBNs is compiled, referred to by the variable unjustNodes, that includes all UBNs of the constraint set representation. Thus, the second unjustNodes list of RecursiveImplyDecisionValue (compiled by the pseudo-code line labeled 3.d.i) includes all UBNs resulting from the input constraint set itself, without need to make additional assumptions regarding whether a node has a controlling value. As with the first unjustNodes list, the second unjustNodes list can also be sorted in reverse levelized order. Also as with the first unjustNodes list, it is passed as a parameter to RecursiveLearnAndImply (in the pseudo-code line labeled 3.d.iii).

Referring to the example of FIG. 4, assume that there is an additional node "z," not shown in FIG. 4, that like "v" is also a UBN as a result of the input constraint set. Consideration of another independently UBN node, such as "z," while exploring another UBN, such as "v," that is also unjustified independent of dynamic assumptions, is an example global learning. Note that while PerformLearningInCircuitFe does iterate over every UBN, it will not, for example, iterate backwards to see whether subsequently considered UBN might effect the learning opportunities of earlier-considered UBNs. Such backward exploration is one advantage of the exploration of the second unjustNodes list. The global learning process is limited to within a certain neighborhood of the current UBN input by only adding to the second unjustNodes list those UBNs that are within a predefined number of levels from the current UBN input (see RecursiveImplyDecisionValue pseudo-code definition, line labeled 3.d.i).

3.2.4.4 Global Learning Example

Another example of the implications that can be learned with the case-based technique is depicted using the following constraints (that happen to be written in the Vera language):

```
rand bit[31:0]a, b;
constraint c1 {
    a in {0:2}
    (a = = 0) => (b = = 2)
    (a = = 1) => (b = = 3)
    (a = = 2) => (b = = 4)
}
```

Figure 10A:
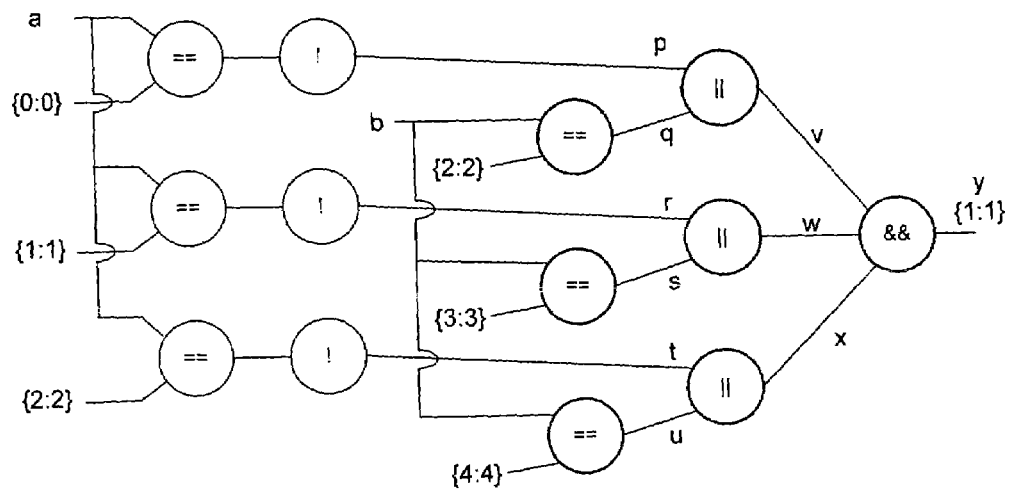
FIGS. 10A–10F depict a constraint set representation, for an example set of constraints, with respect to its unjustified Boolean nodes and implications resulting from them.
Figure 11A:
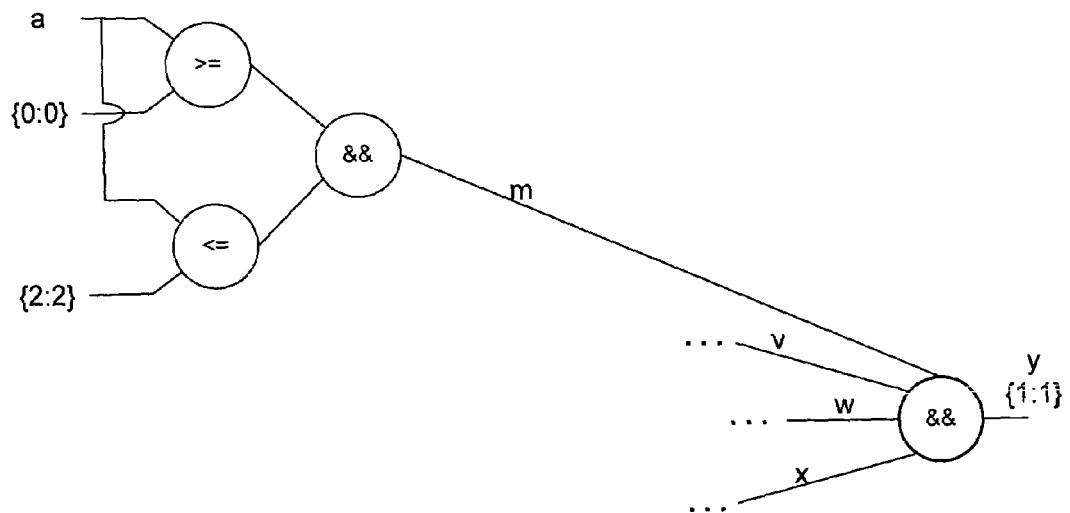
FIGS. 11A–11B depict a constraint set representation, for an example set of constraints, with respect to a constraint that relies upon a justified Boolean node.

FIGS. 10A and 11A show a corresponding constraint set representation for the above fragment. FIG. 11A depicts a constraint set representation for the constraint "a in {0:2}," while FIG. 10A depicts a constraint set representation for the remaining constraints. The possible values for variables "a" and "b" begin as $\{0:2^{32}-1\}$, as indicated in FIGS. 11A and 10A by their lack of any limiting range.

Figure 10B:
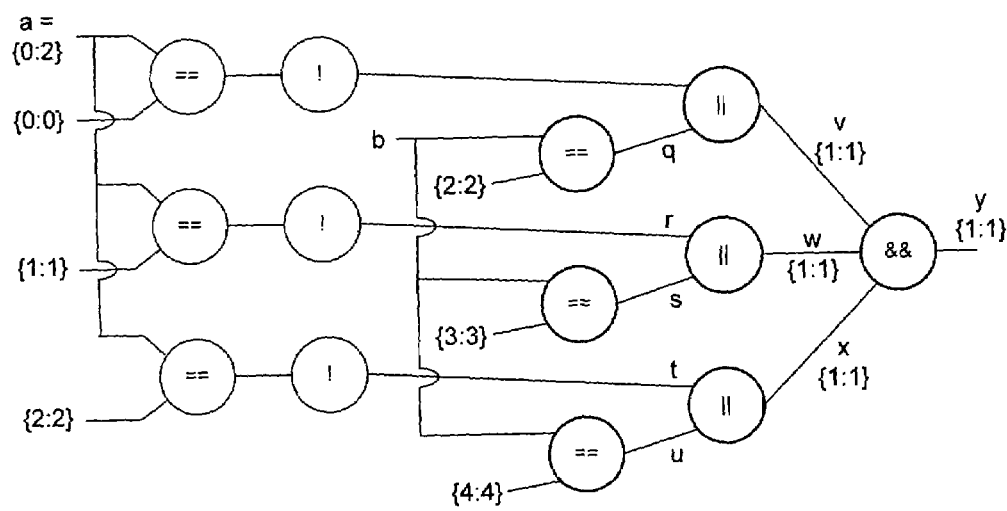
Figure 11B:
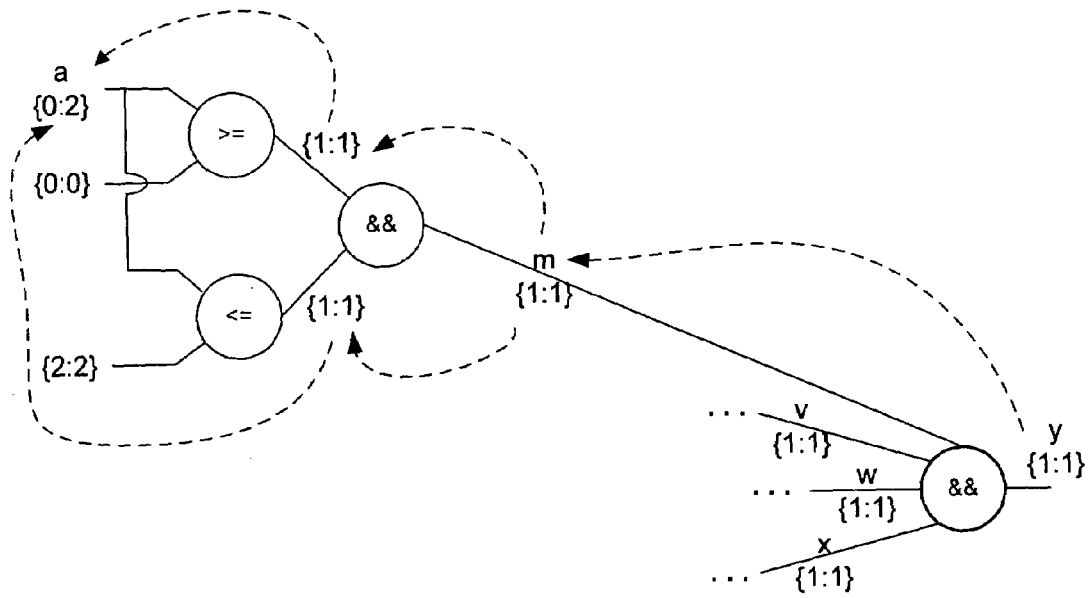

Application of the implication process, and specifically backward implication, to the constraint set representation of FIG. 11A results in the annotated ranges of FIG. 11B. As can be seen, node "a" has been limited to {0:2}, while each of the following nodes has been limited to {1:1}: "v," "w," "x." These implied values for "a", "v," "w" and "x" have been added to the constraint set representation of FIG. 10B. At this point, however, without application of case-based learning, nothing more can be implied about the constraint set representation of FIG. 10B.

The unjustified nodes of FIG. 10B, each of which is a candidate for case-based learning, are "v," "w" and "x."

Figure 10C:
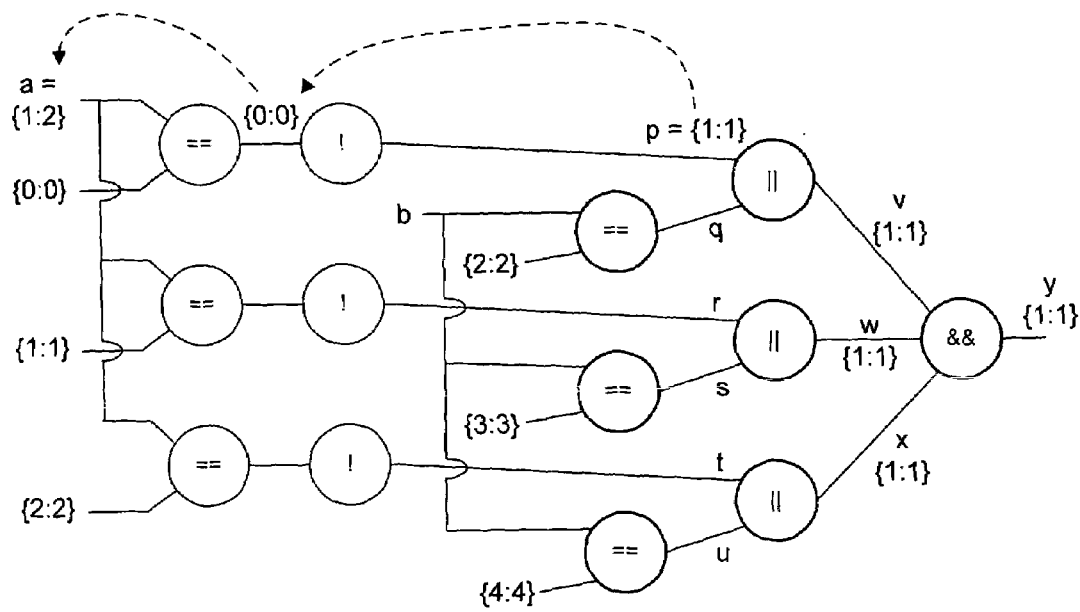
Figure 10D:
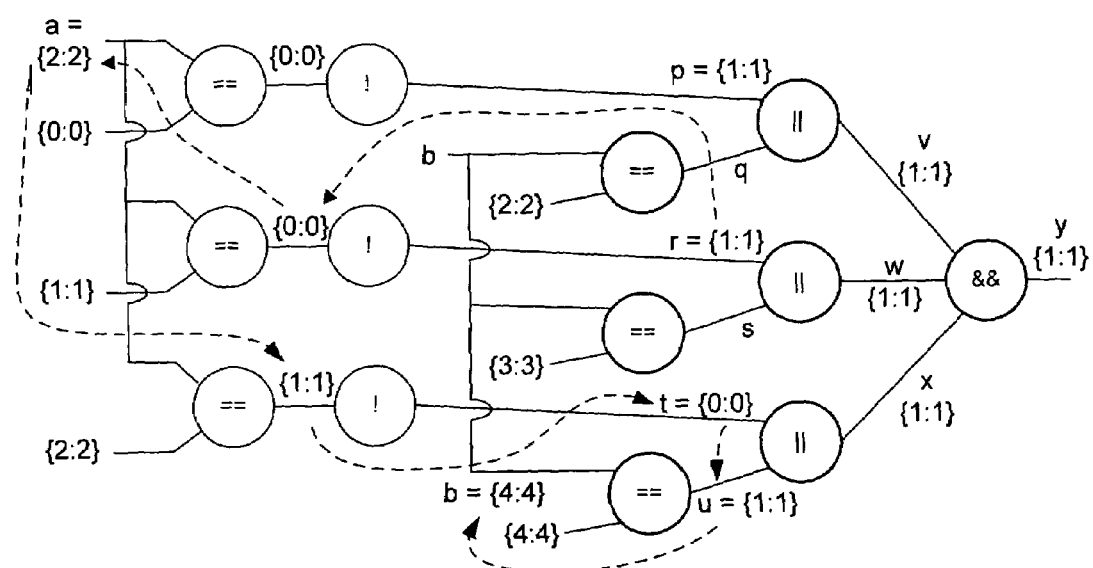
Figure 10E:
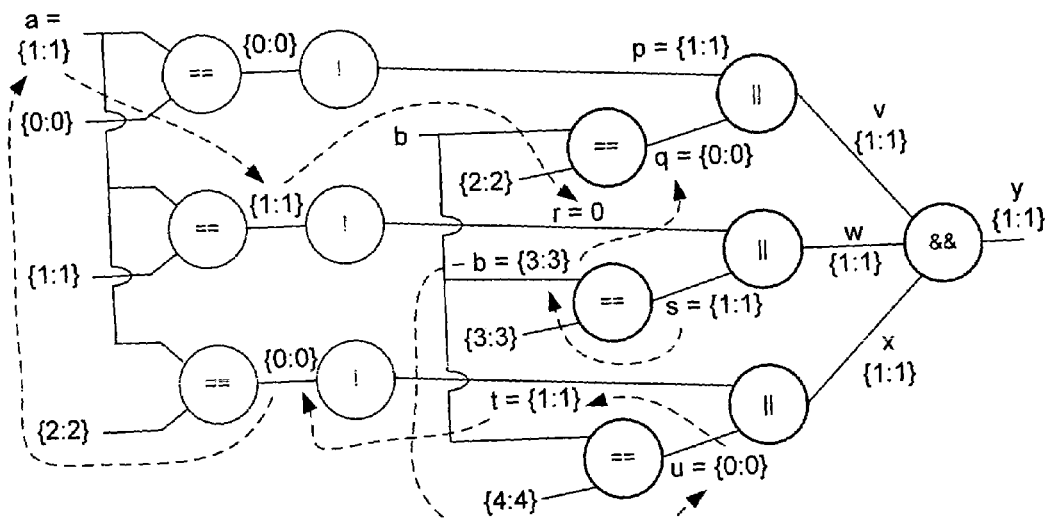
Figure 10F:
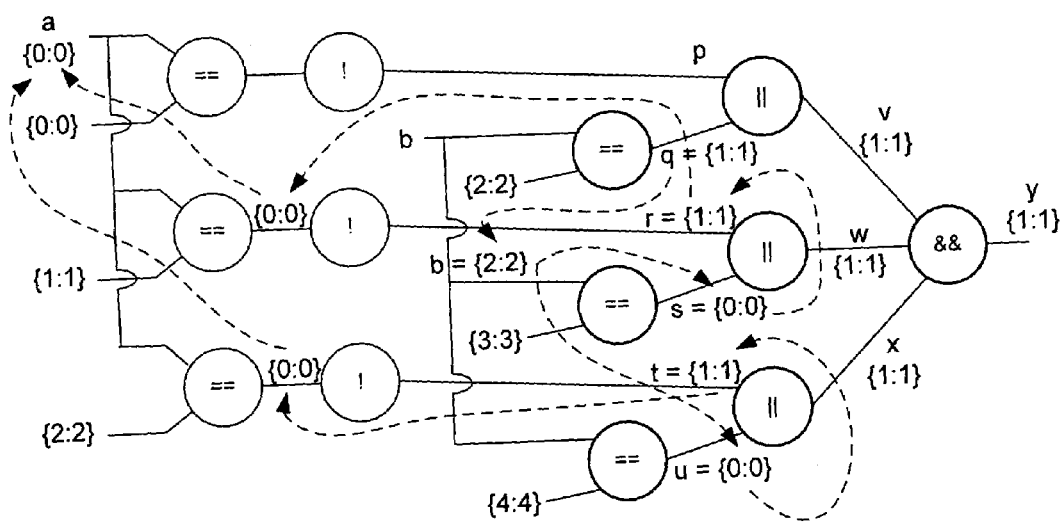

Case-based learning, without global learning, can be applied as follows to the unjustified node "v." FIG. 10C depicts the implications resulting from setting the "p" input to node "v" to a controlling value, while FIG. 10F depicts the implications resulting from setting the "q" input to node "v" to a controlling value. FIG. 10C limits "a" to {1:2}, while FIG. 10F limits "a" to {0:0}, with the union being the same {0:2} range for "a" that was known prior to the application of case-based learning. Similarly, FIG. 10C does not limit "b" (i.e., it remains at its declared range of $\{0:2^{32}-1\}$), while FIG. 10F limits "b" to {2:2}, with the union being the same $\{0:2^{32}-1\}$ range for "b" that was known prior to the application of case-based learning.

Returning to FIG. 10C, an example of global learning, that can be pursued, is as follows. In conjunction with setting "p" to a controlling value, the further effect of a controlling value on either of nodes "r" or "s," with respect to unjustified node "w," can be explored.

Note that similar global learning cannot be pursued, with respect to the setting of "q" to a controlling value (as shown in FIG. 10F), by exploring, in conjunction, the setting of controlling values on any of nodes "r," "s," "t," or "u." This is because the setting of "q" to a controlling value implies values for the inputs to the other two unjustified nodes "w" and "x." Setting "q" to a controlling values implies, with respect to "w," that node "s" is {0:0} while node "r" is {1:1}. Setting "q" to a controlling values implies, with respect to "x," that node "u" is {0:0} while node "t" is {1:1}.

FIG. 10D depicts that setting node "r" to a controlling value limits "a" to {2:2} and "b" to {4:4}. FIG. 10E depicts that setting node "s" to a controlling value limits "a" to {1:1} and "b" to {3:3}.

By using global learning, the result of setting "p" to a controlling value is no longer just "a" being {1:2}, but is also the fact that "b" is {3:4}. Therefore, unioning the results of setting "p" and "q" to a controlling value yields "a" still being {0:2}, but "b" being {2:4}.

3.2.4.5 Other Applications

In general, as discussed above, the case-based learning technique described below is generally applicable to the annotation of word-level networks. Other applications in which the processing of word-level network can be optimized as a result of such annotation include the following: hardware design synthesis, automatic test pattern generation (ATPG), and formal circuit analysis.

A specific example of how the case-based analysis of FIG. 4 can be used to perform more optimal hardware design synthesis is as follows.

The example of FIG. 4 can be considered as a network resulting from a high-level hardware specification, such as Verilog, that has been produced by a hardware translation program, such as HDL Compiler of Synopsys, Inc., Mountain View, USA. The network of FIG. 4, however, is still relatively high-level and it may be desired to translate the word-level network of FIG. 4 into a bit-level network using a hardware translation program such as Design Compiler of Synopsys, Inc.

While the variable "a" of a Verilog specification that produced FIG. 4 may been defined as having 32 bits, it has been determined, by case-based analysis upon the network of FIG. 4, that variable "a" is only to be compared with the values 10, 15 and 20. Therefore, the hardware realization of "a," when translated into a bit-level network, need only have five bits. Thus, a much more efficient hardware realization, compared with providing for 32 bits, can be produced.

An example application of global learning to ATPG is as follows. Specifically, global learning can be applied to gate-level (also referred to as bit-level) ATPG. Unlike simply using recursive learning, global learning permits consideration of several combinations of UBNs. Although the present invention has been described with respect to word-level ranges, with respect to global learning it can also be applied to gate-level designs. The additional implications learned with global learning can be used to generate test vectors and to prove certain faults as untestable. Global learning can be applied statically (as a pre-processor to ATPG) or dynamically (during ATPG).

3.3 Cost Function for Current Decision Variable Selection

Embodiments of the invention pick from among the available primary-input random variables to select the current decision variable (dv). Even when user-defined variable priorities are supported by embodiments of the invention, there can still be multiple available variables at the same priority. In such a case, it may be preferable to determine a cost function to decide which variable to pick first for assignment. Characteristics utilized by the cost function can include the following: i) the input constraint set's structure, including inter-dependencies between the constraints, ii) the number of constraints each variable participates in, iii) types of operators the variable participates in, and iv) the range characteristics of each variable (as specified, for example, by the data structure of the range, such data structure referred to in the pseudo-code herein as a "raceRange" object). An additional characteristic that can be utilized, and one that is adaptive, is the backtracking history of each candidate decision variable.

The cost function guides the constraints-solving process to postpone decisions on variables that are expected to be problematic. By assigning less-problematic variables first, the ranges for problematic variables can potentially shrink, thereby reducing their search-space.

Section 4.5 presents a pseudo-code procedure to compute a cost function. After executing this procedure, a current decision variable is randomly chosen from the computed pruned list of variables.

The pseudo-code of Section 4.5 operates as follows. Part 1.a of Section 4.5 determines, for each node that is a candidate for the current dv (or candidate dv), a metric. The metric is a product of the following three quantities. First, the fanout of the candidate dv. Second, the number of values in range of the candidate dv. Third, the amount of backtracking that needed to be done, when the candidate dv was selected as the current dv as part of finding other solutions to the input constraint set.

Once the metric has been determined, Part 1.b of Section 4.5 stores pairs, of a candidate dv and its metric, in a list called "decList."

Part 2 of Section 4.5 puts the decList list of Part 1.b in ascending order, based upon the metric. This is because the smaller the metric that better the candidate dv.

Part 3 of Section 4.5 picks only a limited number of candidate dv's, for inclusion in prunedList, starting from the beginning of decList. A candidate dv is selected if either test 3.a.i or 3.a.ii is satisfied. Test 3.a.i causes the first candidate dv of decList to always be selected. Test 3.a.ii has two parts that must be satisfied: the metric for a candidate dv must be within a certain percentage of the metric for the last candidate dv chosen; and the total number of candidate dv's selected must not be above a certain pre-defined limit.

3.4 Limiting Current DV to a Single Value: Iterative Relaxation

Figure 14:
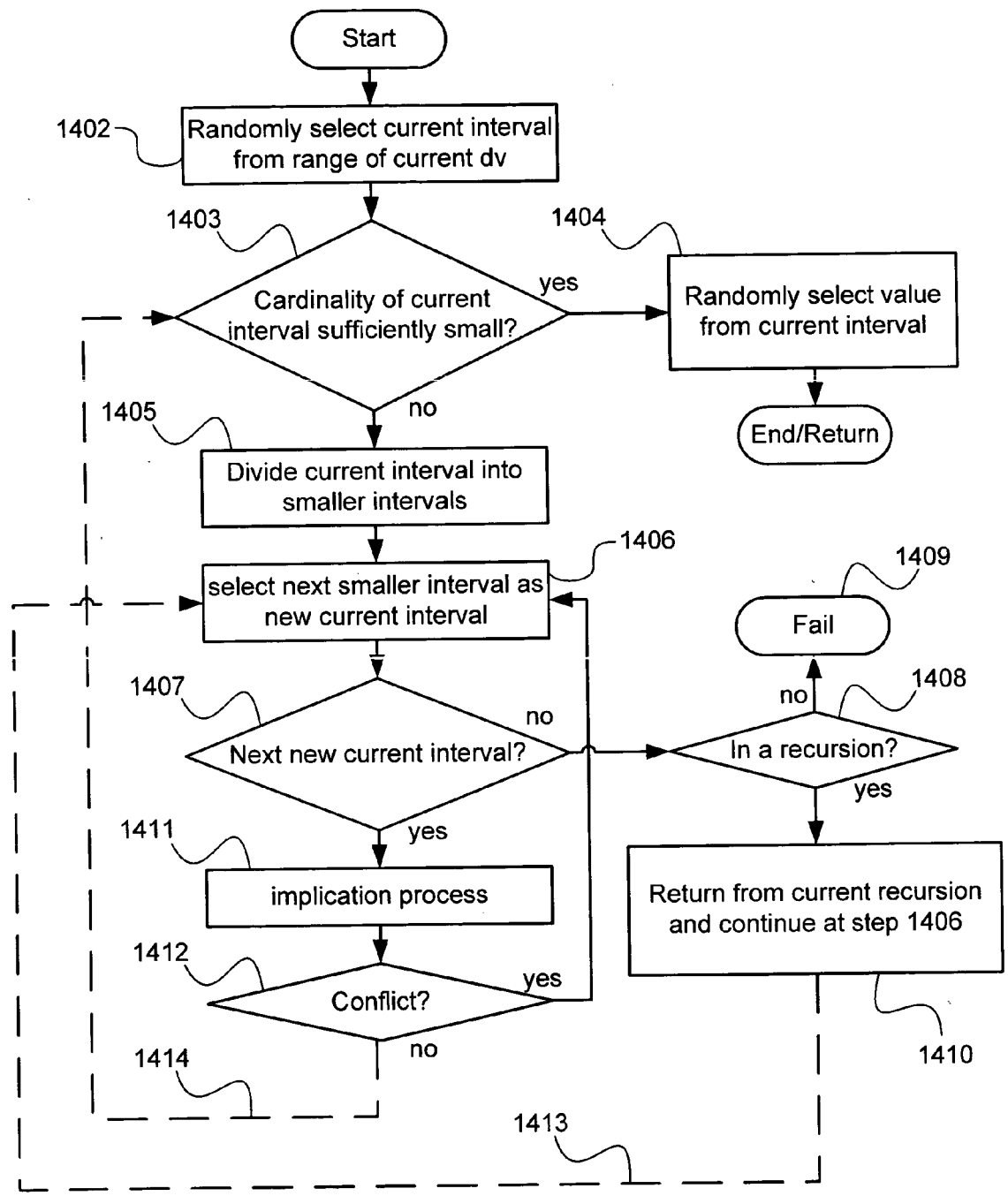
FIG. 14 illustrates a process for iterative relaxation.

Once a current dv has been picked, the next problem is to limit its range to a single value that can be part of a solution to the input constraint set. This can be accomplished by the following process, that is also depicted in FIG. 14.

From the range of the current dv, an interval is randomly selected, that shall be referred to as the current interval (see step 1402).

If the cardinality of the current interval is sufficiently small (see step 1403), then a value from the interval can be selected at random (see step 1404). If the cardinality of the current interval is too large, the following iterative relaxation procedure can be used to reduce its cardinality before selection of a single value is performed.

First, the current interval is divided into a pre-determined number of smaller intervals (see step 1405). In some embodiments, the iterative relaxation procedure divides the current interval into two approximately equal-sized intervals. Then, iteratively, one of the smaller intervals is picked at random as the new current interval (see step 1406).

If the smaller intervals, available for selection as a new current interval, have been exhausted (see step 1407), then either iterative relaxation ends in failing (see step 1409) to find an acceptable value (if it is not currently executing from a recursion as show in step 1408), or it returns from the current recursion level (see step 1410). The return from the current recursion goes back to step 1406, of the higher level invocation, of iteratively selecting one of the smaller intervals such that another such smaller interval can be tried. The return from the current recursion is represented in FIG. 14 by a dashed arrow (labeled 1413) that starts at 1410, a descriptive box regarding how such return is accomplished, and goes to the step (see 1406) of selecting the next smaller interval.

If, however, the smaller intervals, available for selection as a new current interval, have not been exhausted, then the iterative relaxation process continues by performing an implication process (see step 1411). The implication process finds any implications resulting from the limiting of the current interval to the new current interval. If a conflict (see step 1412) results from such implication process, then it is known that, for the entire current interval, there is no valid single value that can be chosen. In this situation, one of the other smaller intervals is selected instead (by step 1406) and the same process, of determining whether there are any valid values to be chosen in the new current interval, is repeated. If a conflict does not result from the implication process upon the new current interval, then the process recurses, with the current interval of the recursive invocation being the new current interval. Such a recursive call is represented in FIG. 14 by a dashed arrow (labeled 1414) from the conflict testing step (1412) to the cardinality testing step (1403).

The recursive invocation begins with dividing the current interval (now the new current interval) into smaller intervals (step 1405). Eventually, when the iterative relaxation search procedure has selected a current interval of sufficiently small size (step 1403 takes the "yes" path), a value of the current interval is randomly selected (by step 1404).

If the iterative relaxation procedure operates by dividing the current interval into two approximately equal-sized intervals, then it has implemented a kind of binary search.

A major benefit of this technique is its elimination of invalid intervals from the range that is to be limited to a single value, thereby improving the probability that the value picked, from a remaining smaller current interval, is valid.

A pseudo-code procedure for iterative relaxation is depicted in Section 4.6. For the current dv, referred to in the pseudo-code as "decNode," the line of the pseudo-code labeled "1" randomly selects an interval referred to as "int1."

Next, the pseudo-code tests labeled 1.a.i and 1.a.ii are evaluated. Test 1.a.i is satisfied if the cardinality of int1 is above a certain pre-defined limit1. Test 1.a.ii is satisfied if the cardinality of int1 is above a pre-defined limit2, and if the backtracking history of decNode is sufficiently discouraging.

If both of tests 1.a.i and 1.a.ii are not satisfied, then section of pseudo-code labeled 1.b does a random selection of a value from int1.

If, however, test 1.a.i or 1.a.ii is satisfied, then the pseudo-code steps labeled 1.a.ii.1 and 1.a.ii.2 are taken in order to further limit the size of int1 before selecting a particular value. Step 1.a.ii.1 divides int1 into a set of smaller intervals, such set referred to as {int2}. Step 1.a.ii.2 randomly selects one of the intervals of {int2}. After identifying a new current interval in step 1.a.ii.2, referred to as a retRange object, the following steps, not shown in the pseudo-code, but discussed above, are taken. Using retRange for the impVals parameter, an implication process is performed through a call to the implication engine of ImplyValuesInCircuitFe. If the implication process is successful, the iterative relaxation process recurses in order to continue refining the size of the interval from an {int2} from which a particular value for the current dv will be chosen.

On the other hand, if a conflict is encountered during the implication process, the entire retRange value is excluded from {int2}, and a new retRange value is selected.

3.5 Backtracking and Gap Representation

As presented in the above overview process, if a conflict is encountered, once a specific value is chosen for the current dv, backtracking is performed by selecting another value for the current dv.

As part of the backtracking mechanism, the specific value chosen for the current dv, that was determined to have produced a conflict, is excluded before the picking of another value for the current dv is performed. This is illustrated with Example 3 and its depiction in FIG. 2. It can be verified that an implication process reduces the range values of variables "a"and "b" to {6:10} and {0:4} respectively. Assume that the procedure for limiting the current dv to a single value, which current dv is assumed to be a, limits a to the following value: a={7:7}. In a subsequent implication, this value assignment backward propagates through the adder to result in b={3:3}. This in turn implies that the output of the subtractor is {4:4}. This, however, represents a conflict because the output of the subtractor is {6:6} (or more precisely, because the intersection of the set containing the value 4 with the set containing the value 6 is the empty set). Consequently, we backtrack on variable "a," by excluding the value {7:7}. Thus the range of "a" is set to following: a={{6:6}, {8:10}}. This implies the following range for the "b" variable: b={{0:2}, {4:4}}. The process for solving the input constraint set continues, for example, by picking another value for "a," unless "a" has been exhausted, in which case the previously current dv is backtracked to. Eventually, the process of the present invention will determine that a=8 and b=2 is the only solution to the input constrain set of Example 3.

3.6 Limiting the Interval-Cardinality of a Range

The implication algorithms of the implication process can be conservative, in the sense that when a compact range representation cannot be derived (either because of difficulties in crafting an algorithm for implication involving a particular operator or because the interval-cardinality of the resulting range would be too large), the implication process returns a broad range for the node, often limited only by the node's basic limitations of precision and sign. This approach is conservative since it only excludes those values from a range that have been definitely determined as not part of any solution to the input constraint set.

Note that while this approach sometimes leads to the retention of values known not to be part of a solution, such retention does not introduce serious performance issues, for many example input constraint sets, for at least the two following reasons. First, once a range is limited to a specific value, the constraint set representation is re-solved, through another application of the implication process, such that the selection of a value, which cannot be part of a solution, will be detected as introducing a conflict. Second, heuristic techniques, such as iterative relaxation, permit the present invention to efficiently handle ranges with large value-cardinality.

3.6.1 Limited Backward Implication: Bit Slice Operator

As with case-based learning described above, the backward implication bit-slice technique described below is generally applicable to the annotation of word-level networks and is not limited to word-level networks as used for constraint set solving.

For some operators backward implication is limited either because of algorithmic complexities or because of interval-cardinality explosion. For example, using a two-value data representation, it can be hard to perform backward implication across a bit slice operator. A bit-slice operator takes an input variable and selects, for output, the value of a range of bits of the input variable, where the range is specified by two other inputs to the bit-slice operator. This is illustrated using the following example (written in OpenVera), referred to as Example 5:

EXAMPLE 5

```
rand bit[31 : 0] a;
constraint c1 {
    a[7:3] = = 9;
}
```

In Example 5, "a" is declared to be a random variable with a width of 32 bits. Example 5 has a single constraint block, called c1, containing a single constraint.

Figure 7:
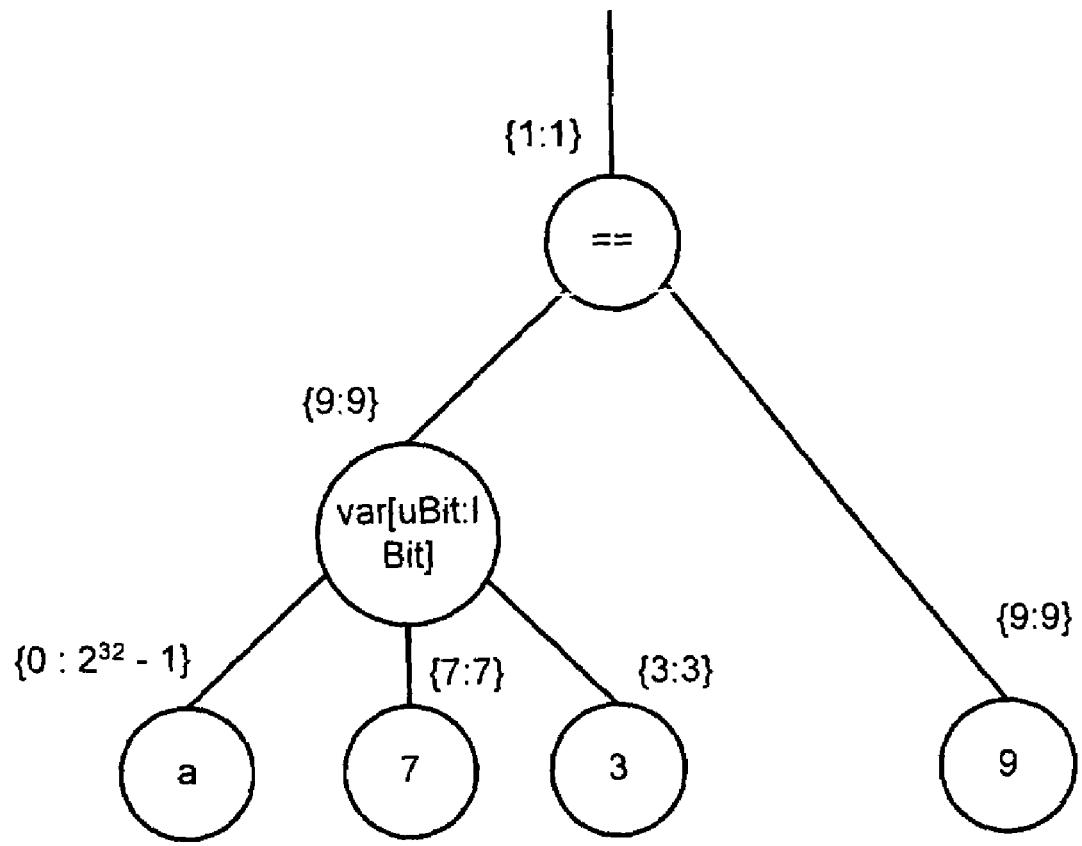
FIG. 7 depicts an example to illustrate implications across a bit slice operator.

A ternary bit slice operator for this constraint, as shown in FIG. 7, has three inputs: variable a, a constant node with value {7:7} (for the upper or "u" bit of the bit slice) and a constant node with value {3:3} (for the lower or "l" bit of the slice). While the output of the bit slice operator is limited to the range {9:9}, it can be procedurally complex to backwards implicate the effect of the {9:9} range to the input variable a. This requires having an interval represent each gap, in the range of $\{0:2^{32}-1\}$, imposed by the bit slice requiring, as the only values included in the range, those 32-bit numbers where the five bits numbered 3 through 7 have the value 9. As discussed in another example below, with respect to the modulo operator, this is an interval-cardinality issue. In the case of the bit-slice operator, and also in the case of the modulo operator example, interval-cardinality can be reduced through introduction of an unknown (or "x") value in a range's representation. Another approach, however, is performing a conservative backward implication during a typical implication process (e.g., the maximum range for "a" is intersected with the current range for "a"). However, when an implication process is begun, where the range for variable "a" is limited to encompass a single value, the value is selected such that it at least satisfies the bit-slice constraints, which minimizes the amount of backtracking performed in finding a solution to the input constraint set.

In some cases, where the number of possible values is large (for example, in the modulo example discussed below where the range is zero plus all even numbers), it can be desirable to select a value, for the rv being limited to a single value, that may not satisfy the constraint and then invoke backtracking when an impermissible value is selected (such as an odd number in the below modulo example).

The rest of this section describes a procedure that is used to efficiently support backward implication of bit-slice operations by selecting a value, for the variable from which the bit slices are taken, that yields the required bit-slices. The following discussion should also be understood in conjunction with the pseudo-code framework of Section 4.7.8. Section 4.7.8.1 addresses forward implication across bit-slice operators. Section 4.7.8.2 addresses backward implication by returning a conservative maximum interval.

First, the generalized problem of satisfying a collection of bit-slice constraints applied to an rv "a" is described, followed by a step-by-step description of the procedure for selecting an initial value that at least satisfies such bit-slice constraints.

While the below procedure is presented in terms of constraints, it can be applied more generally as an efficient way to support the determination of a value for a node, of a word-level network, that is an operand of several bit-slice operators. In the constraints domain, such operand node corresponds to a random variable node. More generally, however, the procedure evaluates a range of values for an operand node that satisfies at least all the bit-slice operators for which it is an operand. At the end of section 3.6.1, an example application of the bit-slice solving technique to hardware synthesis is described.

Consider an n-bit variable "a" which has one or more bit-slice constraints that may or may not overlap. The problem is to find a value for variable "a," that produces all the bit-slices required by its bit-slice constraints. This is illustrated in FIG. 8.

Figure 8:
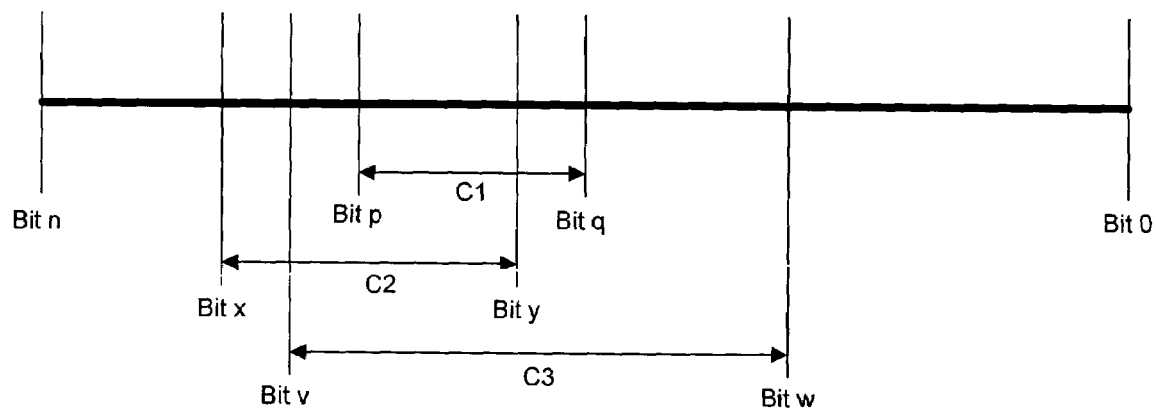
FIG. 8 depicts a generalized example of three bit-slice constraints for various overlapping bits of an n-bit variable.

In FIG. 8, there are three bit-slice constraints (C1, C2, and C3) for various (overlapping) bits of an n-bit variable, "a." For example, C1 is a constraint on a[p:q].

After implications, the output of all bit-slice operators will have the corresponding raceRange values for the bit-slices they model. The bit-slice handling algorithm consists of the following steps:

1. Convert the problem of r bit-slice constraints for an rv "a," which may be overlapping and which may not specify the entire bit range of "a," into an equivalent problem of (r+s) non-overlapping bit-slice constraints whose concatenation equals the entire bit range of "a."
2. Using the raceRange value of the n-bit variable "a," and the raceRange values on the outputs of all the bit-slice operators that model the r bit-slice constraints on variable a, compute raceRange values for all the (r+s) non-overlapping bit-slice constraints. The non-overlapping ranges are identified by marking, upon the bit range of variable "a," the begin and end bit of each of the r constraints. Such bits are referred to herein as "marking bits." Each range of bits in the range of "a," that is bracketed by a pair of marking bits, and does not contain any other marking bits within itself (i.e., other than one or both of the pair of b racketing marking bits), is a non-overlapping range. The concatenation of all such non-overlapping ranges produces a complete bit range for "a." The computation of the range of permissable values, for each such non-overlapping range, involves extracting the appropriate bits from each of the r bit-slice constraints whose range overlaps, to some extent, the non-overlapping range currently being processed. The extracted bits are converted into ranges that are appropriately intersected. Lastly, the range produced for each non-overlapping range (where each such range can be expressed as a raceRange data structure) is intersected with the range (or raceRange data structure) for variable "a" to further refine the newly determined raceRange value for each non-overlapping bit-slice constraint.
3. If the raceRange value for any non-overlapping bit-slice constraint is empty, as computed in Step 2, return FAILURE. This represents a case where overlapping bit-slice constraints cannot be solved-for simultaneously.
4. Using the computed raceRange values for all the (r+s) non-overlapping bit-slices in Step 2, randomly select a value, for each of the non-overlapping bit-slice constraints, using the computed raceRange value for that slice.
5. Concatenate in sequence all the selected raceRange random values of Step 4 to generate a complete random value for the variable "a" that is at least in accord with its bit-slice constraints.
6. If the random value for variable a in Step 5 is not a legal value repeat from Step 4 for a pre-determined number of times.

Figure 12:
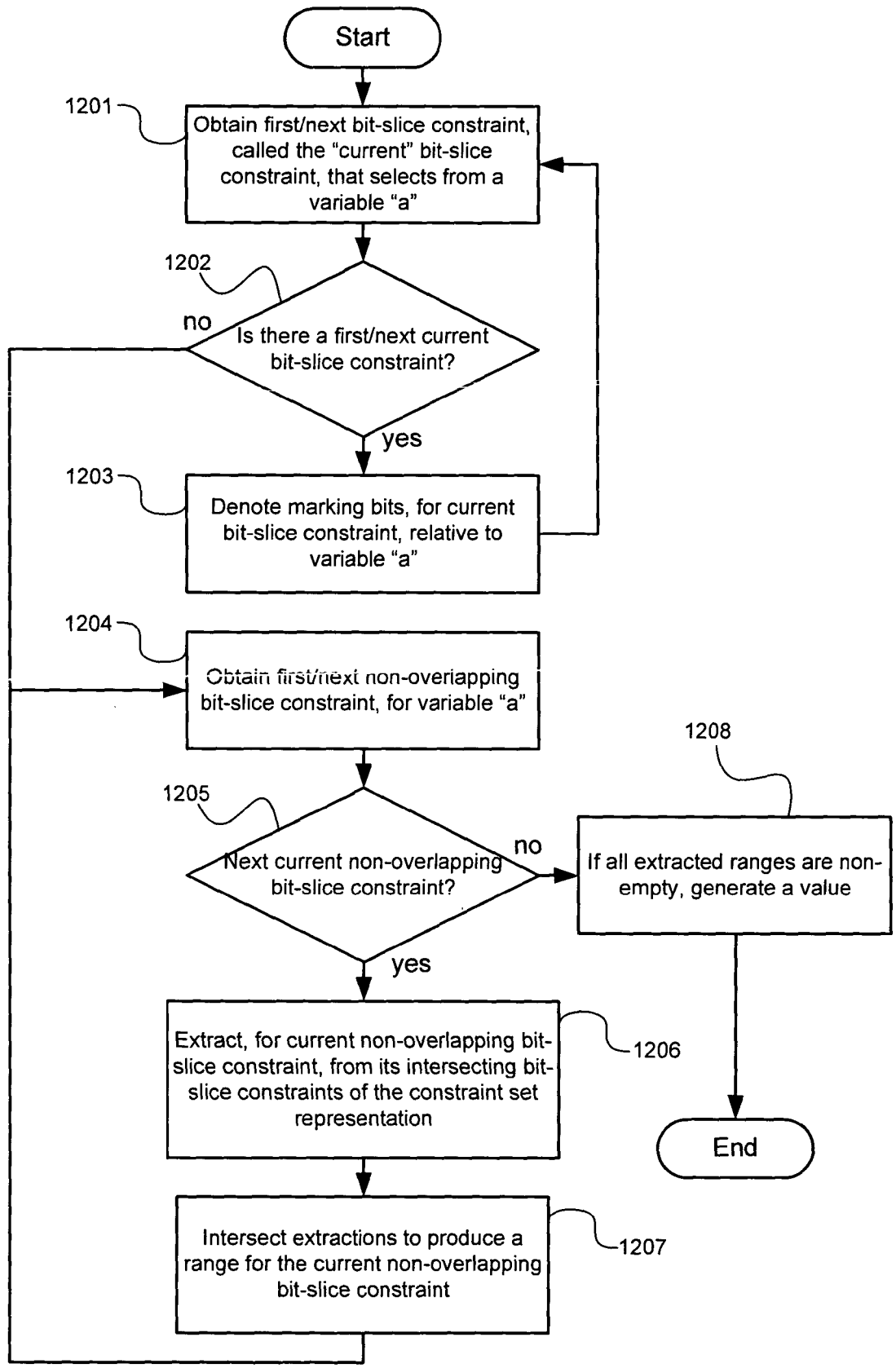
FIG. 12 depicts a process for satisfying bit-slice constraints.

The above steps 1–6 are also addressed by FIG. 12, which illustrates the following steps. Steps 1201 to 1203 of the process of FIG. 12 iterate over each bit-slice constraint, of the constraint set representation, that select from the same variable "a." The current bit-slice constraint, being processed by the loop of steps 1201–1203, is referred to as the "current bit-slice constraint." For each current bit-slice constraint, its marking bits, relative to the variable "a," are denoted. Step 1203.

When the loop of steps 1201–1203 is completed, the "no" branch of step 1202 is taken such that the loop of steps 1204–1207 can be started. The loop of steps 1204–1207 iterates over each non-overlapping constraint, identified by the marking bits of the previous loop. The current non-overlapping bit-slice constraint, being processed by the loop of steps 1204–1207, is referred to as the "current non-overlapping bit-slice constraint." For each current non-overlapping bit-slice constraint, the bit-slice constraints of the constraint set representation, that intersect with the current non-overlapping bit-slice constraint, are identified. Step 1206. In addition, for each bit-slice contraint of the constraint set representation identified, step 1206 extracts the portion of its range that intersects with the range of the current non-overlapping bit-slice constraint. In step 1207, such extracted ranges are intersected to produce a range for the current non-overlapping bit-slice constraint.

When the loop of steps 1204–1207 is completed, the "no" branch of step 1205 is taken such that a value for the variable "a," that satisfies all of its bit-slice constraints of the constraint set representation, can be generated by step 1208.

In order to illustrate this step-by-step procedure in the example of FIG. 8, assume that the original ranges associated with the variable a, a[x:y], a[v:w], a[p:q] be R, R2, R3, and R1 respectively. This overlapping bit-slice problem will be divided into 7 non-overlapping slices, whose concatenation completely covers the bit range of "a," as follows:
1. a[n:x]
2. a[x−1:v]
3. a[v−1:p]
4. a[p−1:y]
5. a[y−1:q]
6. a[q−1:w]
7. a[w−1:0]

Next, we illustrate how the raceRange value for one of these non-overlapping slices is computed. Lets consider computing the raceRange value for the non-overlapping slice a[p−1: y]. This is done in the following steps:
1. Extract a raceRange r1 from R1 by performing a bit-slice operation on R1 for bits [p−1: Y]
2. Extract a raceRange r2 from R2 by performing a bit-slice operation on R2 for bits [p−1: Y]
3. Extract a raceRange r3 from R3 by performing a bit-slice operation on R3 for bits [p−1: Y]
4. Extract a raceRange r4 from R by performing a bit-slice operation on R for bits [p−1: y]
5. The raceRange value for the non-overlapping slice a[p−1: y] is computed as r (r1∩r2∩r3∩r4)

Next, a random value is picked from the newly computed raceRange value, r, for the non-overlapping slice a[p−1: y]. Similarly, such raceRange values are computed for all other non-overlapping slices and a random value is selected for each of them. All these random values for all the non-overlapping slices are concatenated in the order sequence listed above to compute a new random value for variable a. This value is then used as a decision value for implications.

Figure 9:
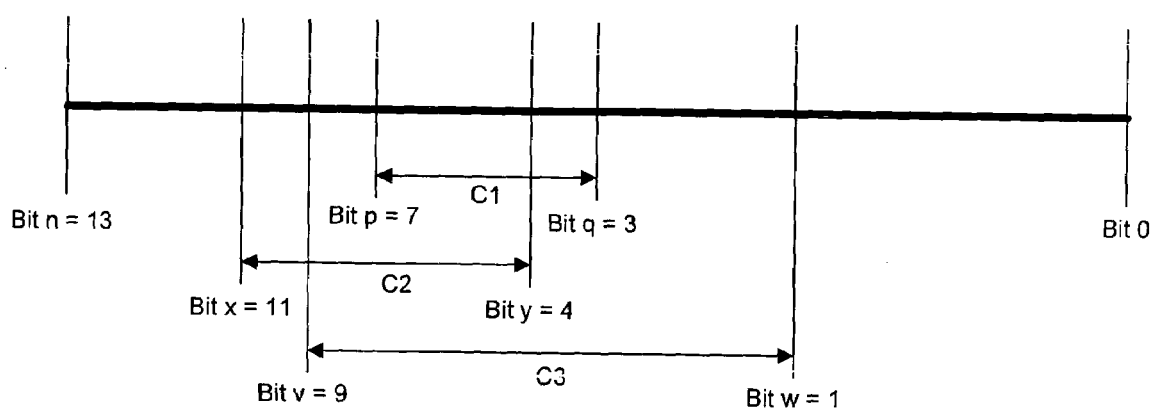
FIG. 9 depicts a specific example of three overlapping bit-slice constraints of a 14-bit variable.

A specific example, in accordance with FIG. 8, is depicted in FIG. 9. This example assumes that "a" is a 14-bit variable, and that the constraints are as follows:

C1: a[7:3]<8
C2: a[11:4]=65
C3: 12<=a[9:1]<25

The backward-implied overlapping ranges for "a" are as follows. Please note that the "x" value is being used below for purposes of explanation and that an implementation need not use an "x" value:

R1: {xxxxxx00000xxx:xxxxxx00111xxx}
R2: {xx01000001xxxx:xx01000001xxxx}
R3: {xxxx000001100x: xxxx000011000x}

The seven non-overlapping ranges extracted from R1–R3 are as follows:

a[13:11]:
  r1: {xxx:xxx}
  r2: {xx0:xx0}
  r3: {xxx:xxx}
  intersection: {xx0:xx0}, which translates to {000:110}
a[10:9]:
  r1: {xx:xx}
  r2: {10:10}
  r3: {x0:x0}
  intersection: {10:10}
a[8:7]:
  r1: {x0:x0}
  r2: {00:00}
  r3: {00:00}
  intersection: {00:00}
a[6:4]:
  r1: {000:011}
  r2: {001:001}
  r3: {001:011}
  intersection is: {001:001}
a[3:3]:
  r1: {0:1}
  r2: {x:x}
  r3: {0:1}
  intersection is: {0:1}
a[2:1]:
  r1: {xx:xx}
  r2: {xx:xx}
  r3: {00:00}
  intersection is: {00:00}
a[0:0]:
  r1: {x:x}
  r2: {x:x}
  r3: {x:x}
  intersection is: {x:x}, which translates to {0:1}

In the area of hardware synthesis, the above-described bit-slice solving technique can be applied as follows. A hardware design (expressed, for example, in a high-level hardware design language such as Verilog), can contain an input bus, along with several bit-slice operators that specify portions of the bus for use in different sections of the design. Based upon the circuitry such bit-slices participate in, the above-described procedure can be used to determine, for example, that the input bus can be of significantly narrower bit-width than had originally been specified for it.

3.6.2 Limited Backward Implication: Modulo Operator

An example constraint (written in OpenVera) of where interval-cardinality would be too large is as follows, labeled Example 2:

EXAMPLE 2

```
rand bit[31 : 0] a;
constraint c1 {
  a mod 2 = = 0;
}
```

In Example 2, "a" is declared to be a random variable with a width of 32 bits. Example 2 has a single constraint block, called c1, containing a single constraint. The constraint states that any value assigned to "a," when a modulo two operation is performed on it, the result must be zero.

Figure 5:
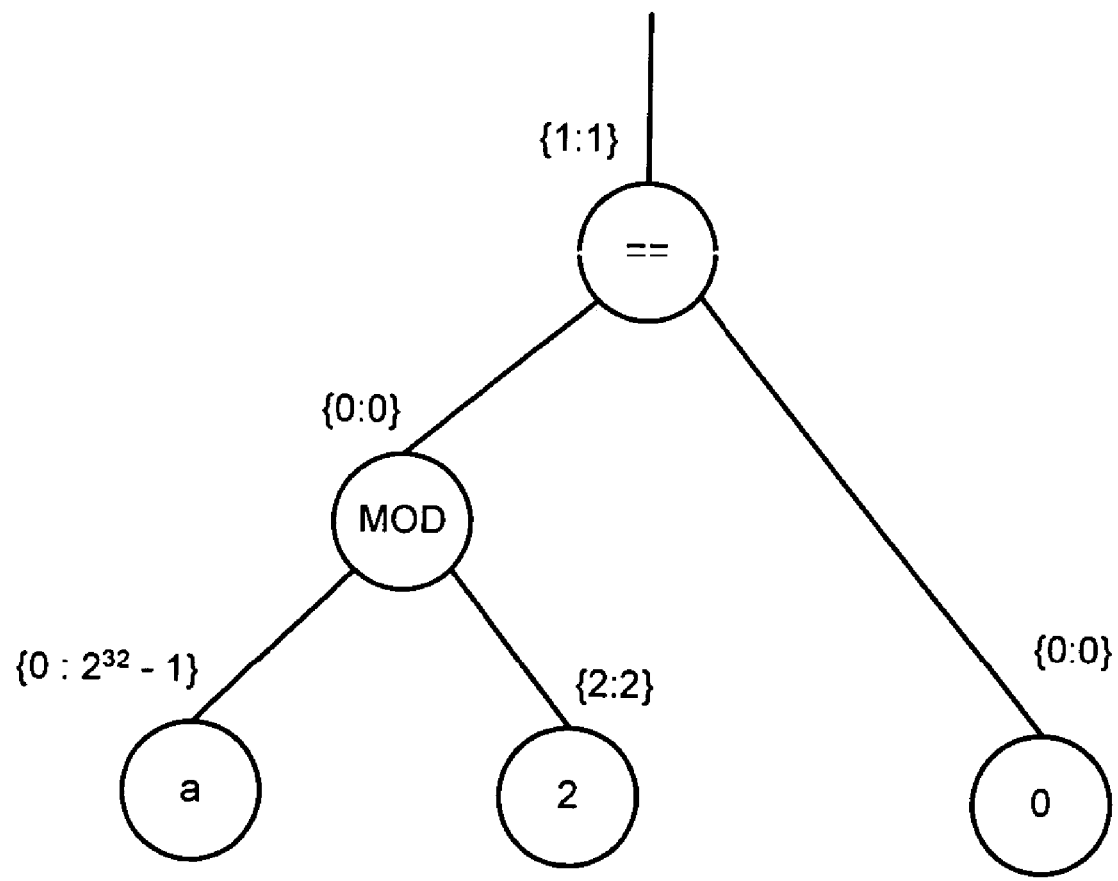
FIG. 5 depicts an example constraint set representation to illustrate the need for interval-cardinality limitation of certain ranges.

FIG. 5 depicts a corresponding constraint set representation for Example 2. Based upon the output of the MOD operator being limited to {0:0}, and the right input being limited to {2:2}, backward implication would indicate that the range of "a" should only include the number zero (expressed as the interval {0:0}) and all even numbers from 2 through $2^{32}-2$. Thus, the range of "a" should be expressed as comprising $2^{31}$ (or two billion) intervals, which range would appear as follows: a={{0:0}, {2:2}, {4:4}, . . . {$2^{32}-2:2^{32}-2$}}.

Assuming, however, that an interval-cardinality for "a" of two billion is larger than desired, given computational resources, the range for "a" can be expressed, conservatively, as shown in FIG. 5, by the following single interval: a={0:$2^{32}-1$}.

In other cases, however, the interval-cardinality may be sufficiently small such that the fully accurate results of the implication process can be expressed in a range. For example, consider the constraint (a>2 && a<7)||(a>=11), where "a" is a 4-bit unsigned random variable. Here, the possible values for "a" are {0:15}. The implication process results in a range for "a"with the following two intervals: a={{3:6}, {11:15}}.

3.7 Limiting the Implication Process: Cyclic Behavior

The implication process, on certain configurations of ranges and operators, can have cyclic behavior. This is demonstrated in the following example, labeled Example 4.

EXAMPLE 4

Consider the Following Constraints

```
rand bit [3 : 0] a, b;
constraint c1 {
  a + b > 4'd14;
  a < 4'd15 - b;
}
```

Example 4 (written in OpenVera), declares two random variables "a" and "b," each of which is four bits in width. The constraint block c1 contains two constraints, both of which must be satisfied.

Figure 6A:
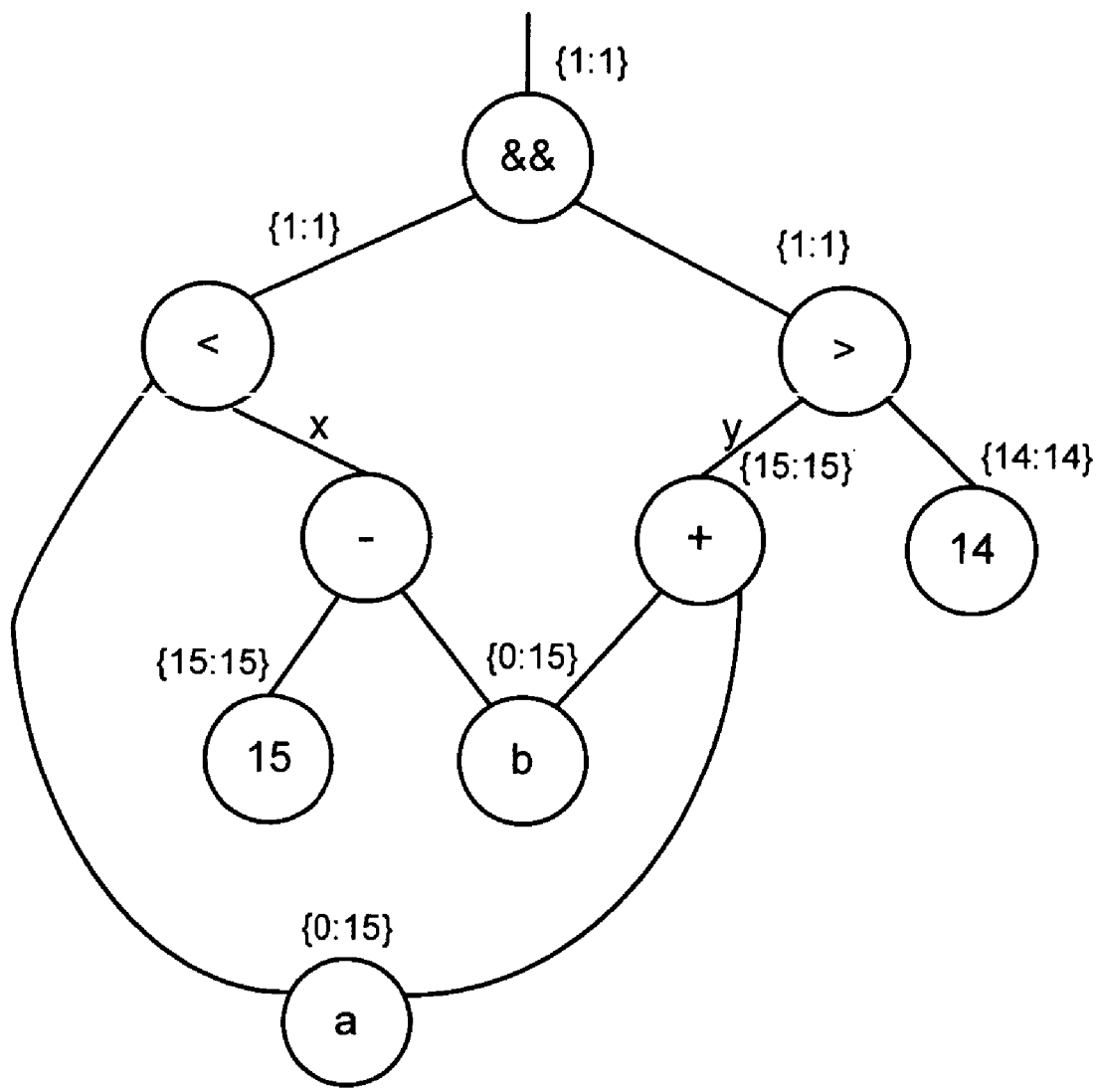
FIGS. 6A–6B depict an example to illustrate cyclic behavior during the implication process.

For simplicity; assume that all node evaluations are performed with 4-bit unsigned precision semantics. FIG. 6A illustrates the high-level constraint set representation for Example 4.

Figure 6B:
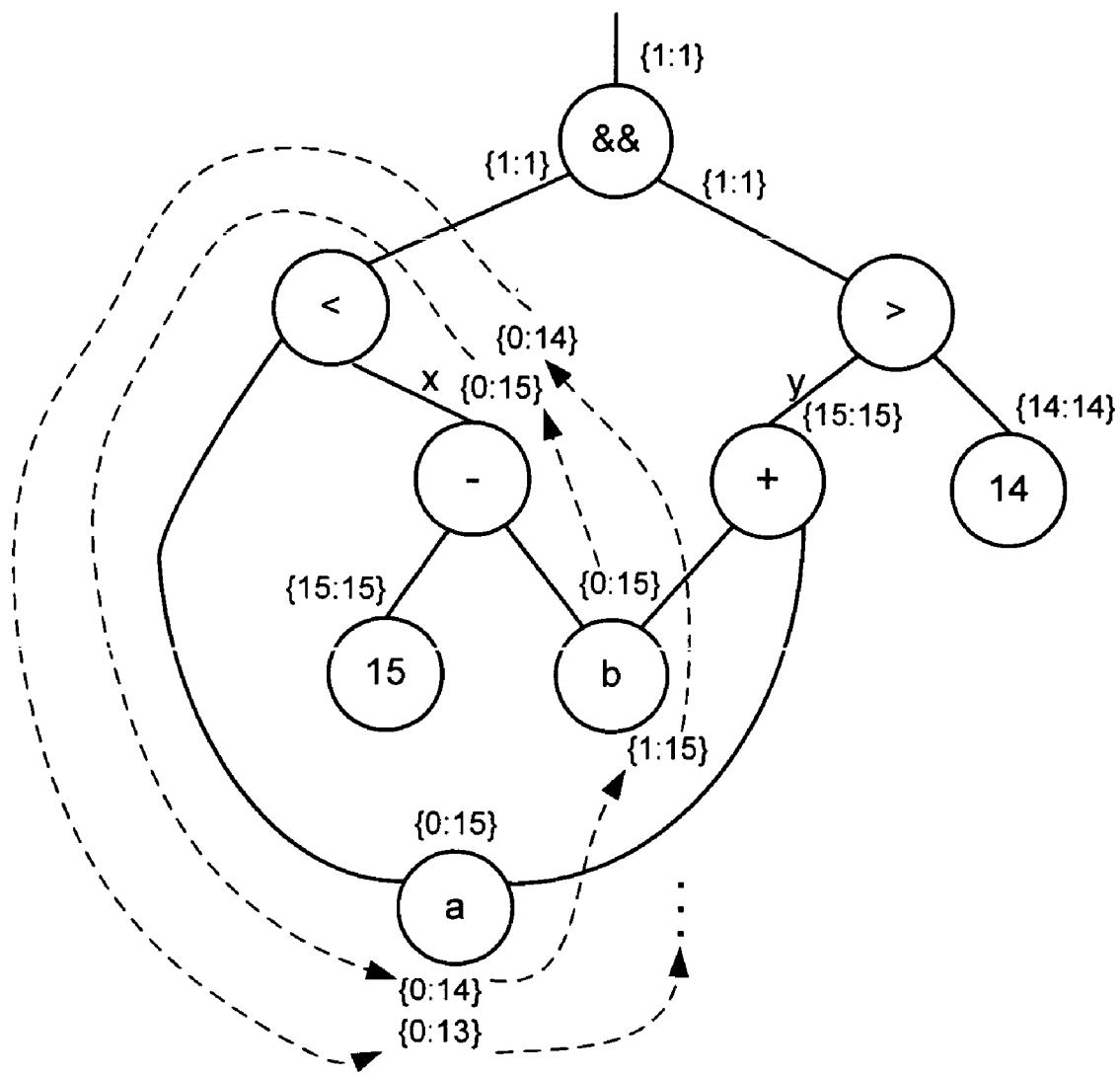

Since a+b>14, we conclude that node y={15:15}. Forward evaluating the node x, we get x={0:15} (using RTL-Verilog wrap-around semantics). This implies a={0:14} through backward propagation across the <comparator. Backward evaluation to node "b" from the output of the adder using the new value of "a" gives b={1:15}. This in turn implies x={0:14}. This in turn implies a={0:13}. This implication cycle will continue as x=>a =>b=>x=>a . . . This cycle is depicted in FIG. 6B. Note that in every iteration, as nodes get re-evaluated, their value range keeps shrinking, thereby giving rise to new implications. If we follow this implication through, we will discover that the range values on "a" and "b" will become empty, thereby representing a conflict in the constraints.

From a theoretical standpoint, for any particular assignment of ranges, successive application of the implication process will converge. However, to impose an upper limit on the implication process, particularly in those cases where cyclic implications arise, it may be preferable to detect cyclic implication processes and to end such cycles after a predetermined number of iterations.

4. Pseudo-Code Listings 4.1 Top-I Vel Function for Implication Engine

```
/* Top-level function for implication engine.
 * impVals is a table of node-value pairs to be implied
 * nodesImplied is the table of node-value pairs that are implied
 */
Boolean ImplyValuesInCircuitFe (impVals, nodesImplied) {
    1. Set the initial values in the passed-in impVals table to the corresponding
       nodes. All these node-value pairs are also inserted in the passed-in
       nodesImplied table.
    2. Create the initial forward and backward queues. A forward and backward
       queue is maintained for each level of the levelized circuit on which
       implications are performed. The fanout nodes of all non-primary-output nodes
       in the nodesImplied table are added to the corresponding forward queue. All
       non-primary-input nodes in the nodesImplied table are added to the
       corresponding backward queue.
    3. retVal = ForwardImply(forwardQueues, backwardQueues, nodesImplied):
       This step performs all forward implications by processing all forwardQueues
       in order, starting with the lowest level. As part of implying forward on a node,
       other nodes may get scheduled for forward propagation and the node itself
       may get scheduled for backward propagation.
    4. If retVal
          a.  retVal = BackwardImply(forwardQueues, backwardQueues,
              nodesImplied): This step performs all backward implications by
              processing all backwardQueues in order, starting with the highest
              level. As part of implying backward on a node, other nodes may get
              scheduled for backward propagation and the node itself may get
              scheduled for forward propagation.
    5. If retVal && pending events in forward or backward queues
          a.  go to Step 3.
    6. return retVal.
}
```

4.2 Forward Implication

```
/* This function is the core forward implication engine */
Boolean ForwardImply (forwardQueues, backwardQueues, nodesImplied) {
    1. Get lowest level forwardQueue. Let this queue be forwardEvents. If
       forwardEvents is empty, go to Step 3.
    2. foreach node in forwardEvents
          a.  newValue = forward evaluate node
          b.  oldValue = current value of node
          c.  if newValue = = oldValue
                i.  Schedule node for backward implications
          d.  Else
                i.  intersectValue = newValue ∩ oldValue
                ii. if intersectValue
                       1. Store node-intersectValue-pair in nodesImplied
                       2. Set value of node to intersectValue
                       3. Schedule node for backward implications
                       4. Schedule fanout nodes of node for forward implications
                iii. Else return false
    3. return true
}
```

4.3 Backward Implication

```
/* This function is the core backward implication engine */
boolean BackwardImply (forwardQueues, backwardQueues, nodesImplied) {
    1. Get highest-level backwardQueue. Let this queue be backwardEvents. If
       backwardEvents is empty, go to Step 3.
    2. Foreach node in backwardEvents
          a. Foreach input_node of node
                i. If value of input_node is not a singleton value
                      1. newValue = backward evaluate to input_node
                      2. OldValue = old value of inputNode
                      3. intersectValue = newValue ∩ oldValue
                      4. if intersectValue is empty, return false
                      5. if newValue != oldValue
                            a. Store node-intersectValue-pair in nodesImplied
                            b. Set value of node to intersectValue
                            c. Schedule input_node for backward implications
                            d. Schedule all fanout nodes of inputNode for
                               forward implications
    3. return true.
}
```

4.4 Case-Based Learning

```
/* Top-level function for performing recursive and global learning, as applied to an initial
implication process (such as step 302 of Figure 3), as opposed to an implication process
performed after a dv has been limited to a single value (such as step 307 of Figure 3).
*/
boolean PerformLearningInCircuitFe(raceCircuit) {
    1. Foreach unjustified Boolean node in raceCircuit
          a. recursiveLearnDepth = 0;
          b. retVal = PerformLearningInCircuit(raceCircuit, node, learnedImps,
             recursiveLearnDepth)
          c. If retVal
                i. retVal = ImplyValuesInCircuitFe(learnedImps, nodesImplied)
          d. else return retVal
    2. return retVal
}
/* Core learning engine */
boolean PerformLearningInCircuit(raceCircuit, node, learnedImps,
recursiveLearnDepth) {
    1. failCount = 0
    2. Foreach input_node of node
          a. sel_value = (controlling value for node using precision and sign of
             input_node) ∩ (current value of input_node)
          b. retVal = RecursiveImplyDecisionValue(raceCircuit, input_node, sel_value,
             nodesImplied, recusriveLearnDepth)
          c. If retVal
                i. if first input_node
                      1. learnedImps = nodesImplied
               ii. else
                      1. Foreach impliedNode in learnedImps
                            a. If impliedNode exists in nodesImplied
                                  i. unionValue = (value of impliedNode in
                                     learnedImps) ∪ (value of impliedNode in
                                     nodesImplied)
                                 ii. insert impliedNode-unionValue pair in
                                     newLearnedImps
                      2. learnedImps = newLearnedImps
          d. else
                i. excludeValue = exclude sel_value from current value of input_node
               ii. Insert input_node-excludeValue pair in excludeImps
              iii. Increment failCount
          e. Restore to state of the circuit before step 1c.
    3. if failCount != 2
          a. learnedImps = learnedImps ∩ excludeImps
          b. return true
    4. else
          a. Empty learnedImps table
          b. Return false
}
/* Core top-level function to perform recursive implications for the
 * passed-in node and sel_value.
```

```
*/
boolean RecursiveImplyDecisionValue(raceCircuit, input_node, sel_value,
nodesImplied, recursiveLearnDepth) {
    1.  Insert input_node-sel_value pair in impVals table
    2.  retVal = ImplyValuesInCircuitFe(impVals, nodesImplied)
    3.  if retVal && (recursiveLearnDepth < MAX_RECURSIVE_LEARN_DEPTH)
            a.  unjustNodes = list of unjustified nodes in nodesImplied
            b.  sort unjustNodes based on reverse levelized order
            c.  retVal = RecursiveLearnAndImply(raceCircuit, unjustNodes, nodesImplied,
                recursiveLearnDepth)
            d.  if retVal && (recursiveLearnDepth = = 0)
                    i.  unjustNodes = list of all unjustified Boolean nodes in raceCircuit that
                        are within a pre-defined number of levels of logic from input_node
                   ii.  sort unjustNodes based on reverse levelized order
                  iii.  retVal = RecursiveLearnAndImply(raceCircuit, unjustNodes,
                        nodesImplied, recursiveLearnDepth)
    4.  return retVal
}
/* Core function to recursively learn implications for all nodes in
 * the passed-in unjustNodes list
 */
boolean RecursiveLearnAndImply(raceCircuit, unjustNodes, nodesImplied) {
    1.  foreach unjust_node in unjustNodes
            a.  if firstNode
                    i.  Increment recursiveLearnDepth
            b.  retVal = PerformLearningInCircuit(raceCircuit, unjust_node, learnedImps,
                recursiveLearnDepth)
            c.  if retVal
                    i.  retVal = ImplyValueInCircuitFe(learnedImps, nodesImplied)
    2.  return retVal
}
```

4.5 Cost Function for Decision Variable Selection

```
1.  Foreach decNode in currently unassigned list of random variables
        a.  Compute nodeScore as a score for the node by multiplying the following
            quantities
                i.   The number of fanout nodes of decNode
               ii.   The cardinality of the number of singleton values in the current
                     raceRange value of decNode
              iii.   The cumulative backtrack count for decNode for a pre-defined
                     number of past calls to the overall constraint-solving procedure that
                     finds solutions to the same input constraint set.
        b.  Insert decNode-nodeScore pair in a decList list of decision nodes
2.  Sort decList in ascending order of the computed scores.
3.  Foreach decNode in decList
        a.  if
                i.   decNode is the first node OR
               ii.   (Score for decNode is within a pre-defined percentage of the
                     previous node) && (the total number of nodes in prunedList has not
                     exceeded a pre-defined limit)
                        1.  Insert decNode in prunedList
        b.  Else
                i.   Return prunedList
4.  return prunedList
```

4.6 Iterative Relaxation

```
1.  For a decision variable, decNode and a randomly selected raceInterval, int1,
        a.  If
                i.   The cardinality of int1 is bigger than a pre-defined limit, limit1 OR
               ii.   (The cardinality of int1 is bigger than a pre-defined limit, limit2 [where
                     limit2 < limit1]) && (The current backtrack count for decNode during
                     this solver run or the cumulative backtrack count of decNode across
                     a pre-defined number of past solver runs for the same constraint
                     problem, exceed pre-defined limits)
                        1.  Split int1 into a pre-defined number of smaller intervals. Let
                            these smaller intervals be {int2}
```

|   |   |   |   |
|---|---|---|---|
|   |   | 2. | retRange = raceRange value representing a randomly selected interval from {int2} |
|   | b. | else |   |
|   |   | i. | retRange = raceRange value representing a randomly selected singleton value from int1 |
| 2. | return retRange |   |   |

4.7 Operator-Specific Implication

This section presents pseudo-code for forward and backward implication across various high-level operators.

Ranges are represented in the pseudo-code by object-oriented programming (OOP) objects of type raceRange. A raceInterval is comprised of a pair of OOP objects of type raceDataType, that represent the lower and upper bound of the raceInterval object.

A raceRange is comprised of a list of intervals, comprised of OOP objects of type raceInterval. While the forward and backward propagation algorithms operate on raceRange objects, at the core of each implication procedure is the implication of raceInterval objects across an operator.

For example, to forward implicate values of a raceRange object across an adder, whose inputs are "a" and "b," first the intervals, resulting from forward implicating on a pairwise basis each raceInterval combination, are computed. The resultant raceInterval objects are merged to create a list of canonical (or non-overlapping) raceInterval objects. This list of raceInterval objects comprises a new raceRange object that represents the result of the forward implication. The operator-specific pseudo-code of this Section focuses only on the raceInterval level of implication. The pseudo-code also assumes that the low-level procedures, for performing primitive operations on raceDataType objects, are available. For example, it is assumed that there exists a procedure to multiply two raceDataType objects.

A raceInterval object is comprised of a pair of OOP objects of type raceDataType. A raceDataType object can represent a number with a bit-width of up to $(2^{32}-1)$ bits, and the number can be signed or unsigned.

The following terminology is used in the pseudo-code. The input raceInterval objects are represented as {l1: h1}, {l2: h2}, {l3: h3}. The input raceInterval is limited to three intervals, for the purposes of illustration, since the operators illustrated by pseudo-code can only have up to three inputs. The raceInterval object on the output of an operator is represented as {o1: o2}.

The following pseudo-code procedure is used by various of the below-given operator-specific implication procedures:

```
/* lhsInterval = {l1:h1}, rhsInterval = {l2:h2} */
raceInterval raceIntersectInterval(lhsInterval, rhsInterval) {
    if (lhsInterval and rhsInterval overlap) {
        o1 = Maximum of l1 and l2
        o2 = Minimum of h1 and h2
        return {o1:o2}
    }
    else {
        return 0
    }
}
```

4.7.1 Arithmetic Operators

4.7.1.1 Forward Propagation

```
+ Operator:
    /* lhsInterval = {l1:h1}, rhsInterval = {l2:h2} */
    raceInterval raceAddInterval(lhsInterval, rhsInterval) {
        return {(l1+l2):(h1+h2)}
    }
- Operator:
    /* lhsInterval = {l1:h1}, rhsInterval = {l2:h2} */
    list raceSubtractInterval(lhsInterval, rhsInterval) {
        retList = list containing intervals {(l1-h2) : (l1-l2)},
                                            {(l1-l2) : (h1 - l2)}
        Merge overlapping intervals in retList from the above operation
        return retList
    }
* Operator:
    /* lhsInterval = {l1:h1}, rhsInterval = {l2:h2} */
    raceInterval raceMultiplyInterval(lhsInterval, rhsInterval) {
        o1 = Minimum of (l1 * l2), (h1 * h2), (l1 * h2), and (h1 * l2)
        o2 = Maximum of (l1 * l2), (h1 * h2), (l1 * h2), and (h1 * l2)
        retInterval = {o1:o2}
        return retInterval
    }
/ Operator:
    /* lhsInterval = {l1:h1}, rhsInterval = {l2:h2} */
    raceInterval raceDivideInterval(lhsInterval, rhsInterval) {
        retInterval = 0
        if (rhsInterval does not have value 0) {
            o1 = Minimum quotient of (l1/l2), (l1/h2), (h1/l2), and (h1 / h2)
            o2 = Maximum quotient of (l1/l2), (l1/h2), (h1/l2), and (h1 / h2)
            retInterval = {o1:o2}
```

-continued

```
            }
            return retInterval
        }
% Operator:
        /* lhsInterval = {l1:h1}, rhsInterval = {l2:h2} */
        raceInterval raceModuloInterval(lhsInterval, rhsInterval) {
                Notation: |p| = absolute value of p
                          q* = two's complement of q
                if (lhsInterval and rhsInterval are values) {
                        retInterval = {l1 % l2 : l1 % l2}
                }
                else {
                        if (lhsInterval is negative && rhsInterval is negative) {
                                retInterval = {0 : min(|l1|, |l2|−1)}
                        }
                        else if (lhsInterval is negative && rhsInterval is positive) {
                                retInterval = {max(l1, (h2 − 1)*) : 0}
                        }
                        else if (lhsInterval is negative &&
                                        rhsInterval is negative and positive) {
                                retInterval = {max(l1, (h2 − 1)*) : min(|l1|, (|l2| − 1))}
                        }
                        else if (lhsInterval is positive && rhsInterval is negative) {
                                retInterval = {max(h1*, (l2 + 1)) : 0}
                        }
                        else if (lhsInterval is positive && rhsInterval is positive) {
                                retInterval = {0 : min(h1, (h2 − 1))}
                        }
                        else if (lhsInterval is positive &&
                                        rhsInterval is negative and positive) {
                                retInterval = {max(h1*, (l2 + 1)) : min(h1, (h2 − 1))}
                        }
                        else if (lhsInterval is negative and positive &&
                                            rhsInterval is negative) {
                                retInterval = {max(h1*, (l2 + 1)) : min(|l1|, (|l2| − 1))}
                        }
                        else if (lhsInterval is negative and positive &&
                                        rhsInterval is positive) {
                                retInterval = {max(l1, (h2 − 1)*) : min(h1, (h2 − 1))}
                        }
                        else if (lhsInterval is negative and positive &&
                                        rhsInterval is negative and positive) {
                                retInterval = {max(l1, (h2 − 1)*, h1*, (l2 + 1)) :
                                                  min(|l1|, (|l2| − 1), h1, h2 − 1)}
                        }
                }
                return retInterval
        }
Unary Minus Operator:
        /* operand = {l:h} */
        list raceUnaryMinusInterval(operand) {
                retList = list containing one interval which is two's complement
                            of operand evaluated in one more bit than that of operand and
                            accounting for any wrap-around semantics for unsigned intervals
                return retList
        }
```

4.7.1.2 Backward Propagation

```
+ Operator:
        /* result = {o1:o2}, operand = {l:h} */
        list raceBackAddInterval(result, operand, numBits, sign) {
                retList = raceSubtractInterval(result, operand)
                minLow = Minimum value for numBits and sign
                maxHigh = Maximum value for numBits and sign
                maxInterval = {minLow:maxHigh}
                retList = list of intervals resulting from intersecting
                        each interval in retList with maxInterval
                return retList
        }
− Operator:
        /* result = {o1:o2}, rhsInterval = {l2:h2} */
        list raceBackLhsSubtractInterval(result, rhsInterval, numBits, sign) {
```

-continued

```
                retList = list containing only one interval {(o1+l2) : (o2+h2)} evaluated in numBits
                        precision
                    return retList
            }
            /* result = {o1:o2}, lhsInterval = {l1:h1}*/
            list raceBackRhsSubtractInterval(result, lhsInterval, numBits, sign) {
                retList = raceSubtractInterval(lhsInterval, result)
                retList = list of intervals resulting from converting all
                        intervals in retList to numBits precision
                return retList
            }
* Operator:
            /* result = {o1:o2}, operand = {l:h} */
            list raceBackMultiplyInterval(result, operand, numBits, sign) {
                minLow = Minimum value for numBits and sign
                maxHigh = Maximum value for numBits and sign
                maxInterval = {minLow:maxHigh}
                if (result has a 0 and operand has a 0) {
                    retList = list containing only maxInterval
                }
                else {
                    operandList = list of interval(s) by excluding 0 from operand
                    foreach operand in operandList {
                        newInterval = raceDivideInterval(result, operand)
                        intervalList = list of interval(s) by excluding 0 from newInterval
                        foreach interval in intervalList {
                            newList = list of interval(s) by expressing interval in numBits
                                    precision
                                Append newList to retList
                        }
                    }
                    Sort retList based on the low data of the intervals and merge any
                        overlapping intervals
                }
                return retList
            }
/ Operator:
            /* result = {o1:o2}, rhsInterval = {l2:h2} */
            list raceBackLhsDivideInterval(result, rhsInterval, numBits, sign) {
                retList = 0
                if (rhsInterval does not have a 0) {
                    minLow = Minimum value for numBits and sign
                    maxHigh = Maximum value for numBits and sign
                    maxInterval = {minLow:maxHigh}
                    tempInt = raceMultiplyInterval(result, rhsInterval)
                    if (rhsInterval !={1:1}) {
                        tempInt = Pad boundaries of tempInt with absolute maximum remainder
                                    value computed from rhsInterval
                    }
                    newInt = raceIntersectInterval(tempInt, maxInterval)
                    retList = list of intervals computed by expressing newInt in numBits
                                    precision
                }
                return retList
            }
            /* result = {o1:o2}, lhsInterval = {l1:h1} */
            list raceBackRhsDivideInterval(result, lhsInterval, numBits, sign) {
                retList = 0
                minLow = Minimum value for numBits and sign
                maxHigh = Maximum value for numBits and sign
                maxInterval = {minLow:maxHigh}
                if (result does not have a 0) {
                    tempInt = raceDivideInterval(lhsInterval, result)
                    if (tempInt) {
                        tempList = list of intervals by excluding 0 from tempInt
                        foreach interval in tempList {
                            newInterval = raceIntersectInterval(interval, maxInterval)
                            newList = list of intervals computed by expressing newInterval
                                        in numBits
                            Append newList to retList
                        }
                    }
                }
                else{
                    retList = list of intervals resulting by excluding 0 from maxInterval
                }
                return retList
            }
% Operator:
```

-continued

```
        /* result = {o1:o2} */
        /* In this case, given that the precise solution may result in many split intervals, we
        conservatively return the maxInterval
        */
        list raceBackModuloInterval(result, numBits, sign) {
            minLow = Minimum value for numBits and sign
            maxHigh = Maximum value for numBits and sign
            maxInterval = {minLow : maxHigh}
            retList = list containing only maxInterval
            return retList
        }
Unary Minus Operator:
        /* result = {o1:o2} */
        list raceBackUnaryMinusInterval(result, numBits, sign) {
            minList = raceUnaryMinusInterval(result)
            retList = list of intervals by converting all intervals in minList to
                     numBits precision
            return retList
        }
```

4.7.2 Relational Operators

4.7.2.1 Forward Propagation

```
>= Operator:
        /* lhsInterval = {l1:h1}, rhsInterval = {l2:h2} */
        raceInterval raceGteInterval(lhsInterval, rhsInterval) {
            if (l1 >= h1) {
                o1 = 1
                o2 = 1
            }
            else if (h1 < l2) {
            o1 = 0
                o2 = 0
            }
            else {
                o1 = 0
                o2 = 1
            }
            return {o1:o2}
        }
> Operator:
        { l1 : h1 } > { l2 : h2 } is algorithmically modeled as [ ! ( { l2 : h2 } >= { l1 : h1 } ) ]
<= Operator:
        { l1 : h1 } <= { l2 : h2 } is algorithmically modeled as [ ( { l2 : h2 } >= { l1 : h1 } ) ]
< Operator:
        { l1 :h1 } < { l2 : h2 } is algorithmically modeled as [ ( { l2 : h2 } > { l1 : h1 } ) ]
== Operator:
        /* lhsInterval = {l1:h1}, rhsInterval = {l2:h2} */
        raceInterval raceEqInterval(lhsInterval, rhsInterval) {
            if ((l1 == h1) && (l2 == h2) && (l1 == l2)) {
                o1 = 1
                o2 = 1
            }
            else if (lhsInterval and rhsInterval overlap) {
            o1 = 0
                o2 = 1
            }
            else {
                o1 = 0
                o2 = 0
            }
            return {o1:o2}
        }
!= Operator:
        { l1 : h1 } != { l2 : h2 } is modeled as [ ! ( { l1 : h1 } == { l2 : h2 } ) ]
```

4.7.2.2 Backward Propagation

```
>= Operator:
    /* lhsInterval = {l1:h1}, rhsInterval = {l2:h2}, result = {o1:o2} */
    raceInterval raceBackLhsGteInterval(result, rhsInterval, numBits, sign) {
        lhsInterval = 0
        minLow = Minimum value for numBits and sign
        maxHigh = Maximum value for numBits and sign
        if (result = = {0:0}) {
            if ((h2-1) >= minLow) {
                l1 = minLow
                h1 = Minimum of (h2-1) and maxHigh
                lhsInterval = {l1:h1}
            }
        }
        else if (result = = {1:1}) {
            if (maxHigh >= (Maximum of minLow and l2)) {
                l1 = Maximum of minLow and l2
                h1 = maxHigh
                lhsInterval = {l1:h1}
            }
        }
        else if (result = = {0:1}) {
            lhsInterval = {minLow:maxHigh}
        }
        return lhsInterval
    }
    /* lhsInterval = {l1:h1}, rhsInterval = {l2:h2}, result = {o1:o2} */
    raceInterval raceBackRhsGteInterval(result, lhsInterval, numBits, sign) {
        rhsInterval = 0
        minLow = Minimum value for numBits and sign
        maxHigh = Maximum value for numBits and sign
        if (result = = {0:0}) {
            if (maxHigh >= (l1+1)) {
                l2 = Maximum of (l1+1) and minLow
                h2 = maxHigh
                rhsInterval = {l2:h2}
            }
        }
        else if (result = = {1:1}) {
            if ((Minimum of maxHigh and h2) >= minLow) {
                l2 = minLow
                h2 = Minimum of maxHigh and h2
                rhsInterval = {l2:h2}
            }
        }
        else if (result = = {0:1}) {
            rhsInterval = {minLow:maxHigh}
        }
        return rhsInterval
    }
> Operator:
    { l1 : h1 } > { l2 : h2 } is algorithmically modeled as [ ! ( { l2 : h2 } >= { l1 : h1 } ) ]
<= Operator:
    { l1 : h1 } <= { l2 : h2 } is algorithmically modeled as [ ( { l2 : h2 } >= { l1 : h1 } ) ]
< Operator:
    { l1 : h1 } < { l2 : h2 } is algorithmically modeled as [ ( { l2 : h2 } > { l1 : h1 } ) ]
= = Operator:
    /* operand = {l:h}, result = {o1:o2} */
    list raceBackEqInterval(result, operand, numBits, sign) {
        retList = 0
        minLow = Minimum value for numBits and sign
        maxHigh = Maximum value for numBits and sign
        maxInterval = {minLow:maxHigh}
        retList = list containing maxInterval
        if (result = = {0:0}) {
            if (l = = h) {
                retList = Intervals resulting by excluding operand from maxInterval
            }
        }
        else if (result = = {1:1}) {
            retList = raceIntersectInterval(operand, maxInterval) computed in
                      numBits precision
        }
        else if (result != {0:1}) {
            retList = 0
        }
        return retList
    }
```

-continued

!= Operator:
    { l1 : h1 } != { l2 : h2 } is modeled as [ ! ( { l1 : h1 } = = { l2 : h2 } ) ]

4.7.3 Boolean Operators 4.7.3.1 Forward Propagation

```
&& Operator:
    /* lhsInterval = {l1:h1}, rhsInterval = {l2:h2} */
    raceInterval raceBoolAndInterval(lhsInterval, rhsInterval) {
        if (lhsInterval = = {0:0} || rhsInterval = = {0:0}) {
            o1 = 0
            o2 = 0
        }
        else if (lhsInterval does not have 0 &&
                 rhsInterval does not have 0) {
            o1 = 1
            o2 = 1
        }
        else {
            o1 = 0
            o2 = 1
        }
        return {o1:o2}
    }
|| Operator:
    /* lhsInterval = {l1:h1}, rhsInterval = {l2:h2} */
    raceInterval raceBoolOrInterval(lhsInterval, rhsInterval) {
        if (lhsInterval = = {0:0} && rhsInterval = = {0:0}) {
            o1 = 0
            o2 = 0
        }
        else if (lhsInterval does not have 0 ||
                 rhsInterval does not have 0) {
            o1 = 1
            o2 = 1
        }
        else {
            o1 = 0
            o2 = 1
        }
        return {o1:o2}
    }
! Operator:
    /* operand = {l:h} */
    raceInterval raceBoolNegateInterval(operand) {
        if (operand = = {0:0}) {
            o1 = 1
            o2 = 1
        }
        else if (operand does not have 0) {
            o1 = 0
            o2 = 0
        }
        else {
            o1 = 0
            o2 = 1
        }
        return {o1:o2}
    }
```

4.7.3.2 Backward Propagation

```
&& Operator:
    /* operand = {l:h}, result = {o1:o2} */
    list raceBackBoolAndInterval(result, operand, numBits, sign) {
        retList = 0
        if (result = = {0:0} &&
            operand does not have 0) {
            retList = list containing only {0:0}
        }
```

-continued

```
        }
        else {
            minLow = Minimum value for numBits and sign
            maxHigh = Maximum value for numBits and sign
            maxInterval = {minLow : maxHigh}
            if (result = = {1:1}) {
                retList = List of intervals resulting by excluding 0
                    from maxInterval
            }
            else if (result = = {0:1}) {
                retList = list containing only maxInterval
            }
        }
        return retList
    }
|| Operator:
    /* operand = {l:h}, result = {o1:o2} */
    list raceBackBoolOrInterval(result, operand, numBits, sign) {
        retList = 0
        if (result = = {0:0}) {
            retList = list containing only {0:0}
        }
        else {
            minLow = Minimum value for numBits and sign
            maxHigh = Maximum value for numBits and sign
            maxInterval = {minLow : maxHigh}
            if (result = = {1:1} && operand = = {0:0}) {
                retList = List of intervals resulting by excluding 0
                    from maxInterval
            }
            else if (result = = {0:1}) {
                retList = List containing only maxInterval
            }
        }
        return retList
    }
! Operator:
    /* result = {o1:o2} */
    list raceBackBoolNegateInterval(result, numBits, sign) {
        retList = 0
        minLow = Minimum value for numBits and sign
        maxHigh = Maximum value for numBits and sign
        maxInterval = {minLow : maxHigh}
        if (result = = {0:0}) {
            retList = list of intervals resulting by excluding 0
                from maxInterval
        }
        else if (result = = {1:1} {
            retList = list containing only {0:0}
        }
        else if (result = = {0:1}) {
            retList = list containing only maxInterval
        }
        return retList
    }
```

4.7.4 Unary Reduction Operators 4.7.4.1 Forward Propagation

```
& Operator:
    /* operand = {l:h} */
    raceInterval raceUnaryAndInterval(operand) {
        if (all bits of operand are 1) {
            retInterval = {1:1}
        }
```

```
        else if (operand does not contain the "all ones" value) {
            retInterval = {0:0}
        }
        else {
            retInterval = {0:1}
        }
        return retInterval
    }
| Operator:
    /* operand = {l:h} */
    raceInterval raceUnaryOrInterval(operand) {
        if (operand = = {0:0}) {
            retInterval = {0:0}
        }
        else if (operand does not contain the 0 value) {
            retInterval = {1:1}
        }
        else {
            retInterval = {0:1}
        }
        return retInterval
    }
^ Operator:
    /* operand = {l:h} */
    raceInterval raceUnaryXorInterval(operand) {
        retInterval = {0:1}
        if (l = = h) {
            if (l has odd number of ones) {
                retInterval = {1:1}
            }
            else if (l has even number of ones) {
                retInterval = {0:0}
            }
        }
        return retInterval
    }
~& Operator:
    ~& { l1 : h1 } is algorithmically modeled as [ ! ( & {l1 : h1 } ) ]
~| Operator:
    ~| { l1 : h1 } is algorithmically modeled as [ ! ( | { l1 : h1 } ) ]
~^ Operator:
    ~^ { l1 : h1 } is algorithmically modeled as [ ! ( ^ { l1 : h1 } ) ]
```

4.7.4.2 Backward Propagation

```
& Operator:
                    /* result = {o1:o2} */
                    list raceBackUnaryAndInterval(result, numBits, sign) {
                        retList = 0
                        minLow = Minimum value for numBits and sign
                        maxHigh = Maximum value for numBits and sign
                        maxInterval = {minLow : maxHigh}
                        if (result == {1:1}) {
                            retList = list containing only one interval {p:p}, where
                                p is a value with all bits = 1
                        }
                        else if (result == {0:0}) {
                            retList = list of intervals resulting by excluding {p:p} from
                                    maxInterval, where p is a value with all bits = 1
                        }
                        else if (result == {0:1}) {
                            retList = list containing only maxInterval
                        }
                        return retList
                    }
| Operator:
                    /* result = {o1:o2} */
                    list raceBackUnaryOrInterval(result, numBits, sign) {
                        retList = 0
                        minLow = Minimum value for numBits and sign
                        maxHigh = Maximum value for numBits and sign
                        maxInterval = {minLow : maxHigh}
                        if (result == {0:0}) {
                            retList = list containing only one interval {p:p}, where
                                p is a value with all bits = 0
                        }
                        else if (result == {1:1}) {
                            retList = list of intervals resulting by excluding {p:p} from
                                    maxInterval, where p is a value with all bits = 0
                        }
                        else if (result == {0:1}) {
                            retList = list containing only maxInterval
                        }
                        return retList
                    }
^ Operator:
                    /* result = {o1:o2} */
                    /* In this case, given that the precise solution may result in many split intervals (for
                    example, all intervals with values that have even number of ones or odd number of
                    ones), we conservatively return the maxInterval
                    */
                    list raceBackUnaryXorInterval(result, numBits, sign) {
                        minLow = Minimum value for numBits and sign
                        maxHigh = Maximum value for numBits and sign
```

```
                maxInterval = {minLow : maxHigh}
                retList = list containing only maxInterval
                return retList
        }
~& Operator:
        ~& { l1 : h1 } is algorithmically modeled as [ ! ( & { l1 : h1 } ) ]
~| Operator:
        ~| { l1 : h1 } is algorithmically modeled as [ ! ( | { l1 : h1 } ) ]
~^ Operator:
        ~^ { l1 : h1 } is algorithmically modeled as [ ! ( ^ { l1 : h1 } ) ]
```

4.7.5 Shift Operators

4.7.5.1 Forward Propagation

```
<< Operator:
        /* lhsInterval = { l1 : h1 }, rhsInterval = { l2 : h2 } */
        raceInterval raceLeftShiftInterval(lhsInterval, rhsInterval) {
                numBits = precision of l1
                if (l1 is positive) {
                        lhsShift = left shift l1 by l2 in (2*numBits)
                            precision
                }
                else {
                        lhsShift = left shift l1 by h2 in (2*numBits)
                            precision
                }
                lowData = lhsShift expressed in numBits precision
                if(lowData != lhsShift) {
                        lowData = 0
                }
                numBits = precision of h1
                if (h1 is positive) {
                        lhsShift = left shift h1 by h2 in (2*numBits)
                            precision
                }
                else {
                        lhsShift = left shift h1 by l2 in (2*numBits)
                            precision
                }
                highData = lhsShift expressed in numBits precision
                if (highData != lhsShift) {
                        highData = 0
                }
                if (lowData && highData) {
                        return { lowData : highData }
                }
                else {
                        minLow = Minimum value for numBits and sign
                        maxHigh = Maximum value for numBits and sign
                        return {minLow : maxHigh}
                }
        }
>> Operator:
        /* lhsInterval = { l1 : h1 }, rhsInterval = { l2 : h2 } */
        raceInterval raceRightShiftInterval(lhsInterval, rhsInterval) {
```

```
                if ({l1:h1} = {positive:positive}) {
                        {o1:o2} = {l1 >> h2 : h1 >> l2}
                }
                else if ({l1:h1} = {negative:negative}) {
                        if (l2 = = 0) {
                                if (h2 = = 0) {
                                        {o1:o2} = {l1:h1}
                                }
                                else {
                                        {o1:o2} = {l1:h1 >> 1}
                                }
                        }
                        else {
                                {o1:o2} = {l1 >> h2 : h1 >> l2}
                        }
                }
                else if ({l1:h1} = {negative:positive}) {
                        if (l2 = = 0) {
                                if (h2 = = 0) {
                                        {o1:o2} = {l1:h1}
                                }
                                else {
                                        {o1:o2} = {l1 : -1 >> 1}
                                }
                        }
                        else {
                                {o1:o2} = {0 : -1 >> 1}
                        }
                }
                return {o1:o2}
        }
```

4.7.5.2 Backward Propagation

All backward propagations across all shift operators conservatively return the maximum interval for the precision and sign used in the propagation.

4.7.6 Concatenation Operators

4.7.6.1 Forward Propagation

```
{ } Operator:
        /* lhsInterval = { l1 : h1 }, rhsInterval = { l2 : h2 }, p =
        precision of rhsInterval */
        raceInterval raceConcatenateInterval(lhsInterval, rhsInterval) {
                if (rhsInterval has both negative and positive elements) {
                        o1 = l1 concatenated with p number of 0s
                        o2 = h1 concatenated with p number of 0s
                }
                else {
                        o1 = l1 concatenated with l2
                        o2 = h1 concatenated with h2
                }
```

-continued

```
            return {o1 : o2}
        }
    { } Repetition Operator:
        /* lhsInterval = { l1 : h1 }, rhsInterval = { m : m }*/
        list raceConcatenateRepInterval(lhsInterval, rhsInterval) {
            retList = 0
            newPrecision = precision of lhsInterval * m
            p = precision of lhsInterval
            offset = raceGetConcatenateRepOffset(m, p, newPrecision)
            lhsList = list of intervals by splitting lhsIntervals into
            completely
                     positive intervals or completely negative intervals
            foreach interval, myInt, in lhsList {
                lowerBound =
                raceGetConcatenateRepValue(myInt.low, offset,
                        newPrecision)
                upperBound =
                raceGetConcatenateRepValue(myInt.high, offset,
                        newPrecision)
                1. v = lowerBound + offset evaluated in
                newPrecision
                2. newInterval = {v : v}
                3. Append newInterval to retList
                4. lowerBound = v
                5. if v != upperBound goto Step 1
            }
            return retList
        }
        raceDataType raceConcatenateRepOffset(rhsValue, lhsPrecision,
    newPrecision) {
            m = rhsValue
            p = lhsPrecision
            offset = 2 ^((m−1)p) + 2 ^((m−2)p) + ... + 2 ^((m−(m−1))p) + 1
            Express offset in newPrecision number of bits
            return offset
        }
        raceDataType raceConcatenateRepValue(myValue, offset,
    newPrecision) {
            if (myValue is negative) {
                retData = ((myValue + 1) * offset) − 1
            }
            else {
                retData = myValue * offset
            }
            Express retData in newPrecision number of bits
            return retData
        }
```

4.7.6.2 Backward Propagation

```
    { } Operator:
        /* result = { o1 : o2 }, rhsInterval = { l2 : h2 } */
        list raceBackLhsConcatenateInterval(result, rhsInterval,
        numBits, sign) {
            retList = 0
            if (precision of result == precision of rhsInterval +
            numBits) {
                l1 = o1 right shifted by precision of rhsInterval
                    and expressed in
                        numBits precision
                l2 = o2 right shifted by precision of rhsInterval
                    and expressed in
                        numBits precision
                retList = list containing only {l1 : l2}
            }
            return retList
        }
        /* result = { o1 : o2 }, lhsInt rval = { l1 : h1 } */
        list raceBackRhsCncatenateInterval(result, lhsInt rval,
        numBits, sign) {
            retList = 0
            if (precision of result == precision of lhsInterval +
            numBits) {
                l1 = o1 expressed in numBits precision
```

-continued

```
                l2 = o2 expressed in numBits precision
                if(l1 > l2) {
                    retList = list of intervals that wrap-around
                        from l2 to l1 in
                            numBits precision
                }
                else {
                    retList = list containing only {l1 : l2}
                }
            }
            return retList
        }
    { } Repetition Operator:
        /* result = { o1 : o2 } */
        list raceBackLhsConcatenateRepInterval(result, numBits,
        sign) {
            retList = list containing only one interval Uthat is the
            result
                interval truncated to numBits precision.
            return retList
        }
```

4.7.7 Conditional Operator

4.7.7.1 Forward Propagation

```
/* data1Interval = {l1:h1}, data2Interval = {l2:h2}, controlInterval =
{l3:h3} */
list raceMuxInterval(data1Interval, data2Interval, controlInterval) {
    if (controlInterval = = {0:0}) {
        retList = list containing only data2Interval
    }
    else if (controlInterval does not have a 0) {
        retList = list containing only data1Interval
    }
    else {
        retList = list containing only (data1Interval ∪
            data2Interval)
    }
    return retList
}
```

4.7.7.2 Backward Propagation

```
Backward propagation to data inputs:
    /* result = {o1:o2}, controlInt = {l3:h3} */
    list raceBackDataMuxInterval(result, controlInt, numInput, numBits,
        sign) {
        if ((numInput = = 1 && controlInt does not have a 0) ||
                (numInput = = 2 && controlInt = = {0:0})) {
            retList = list containing only result interpreted in
                numBits
                    precision
        }
        else if (numInput = = 1 || numInput = = 0) {
                minLow = Minimum value for numBits and sign
                maxHigh = Maximum value for numBits and sign
                maxInterval = {minLow : maxHigh}
                retList = list containing only maxInterval
        }
        return retList
    }
Backward propagation to control input:
    /* result = {o1:o2}, data1Interval = {l1:h1}, data2Interval =
    {l2:h2} */
    list raceBackControlMuxInterval(result, data1Interval, data2Interval,
                        numBits, sign) {
        int1 = raceIntersectInterval(result, data1Interval)
        int2 = raceIntersectInterval(result, data2Interval)
        minLow = Minimum value for numBits and sign
        maxHigh = Maximum value for numBits and sign
        maxInterval = {minLow : maxHigh}
        if (int1 && int2) {
            retList = list containing only maxInterval
        }
        else if (int1 && !int2) {
            retList = list of intervals resulting by excluding 0
                from maxInterval
        }
        else if (!int1 && int2) {
            retList = list containing only {0:0}
        }
        else {
            retList = 0
        }
        return retList
    }
```

4.7.8 Bit Slice Operator

4.7.8.1 Forward Propagation

```
/* dataInterval = {l1:h1}, startInterval = {l2:h2}, endInterval = {l3:h3} */
list raceBitSliceInterval(dataInterval, startInterval, endInterval) {
    shiftInt = raceRightShiftInterval(dataInterval, endInterval)
    nBitsInt = {(l2−l3+1) : (l2−l3+1)}
    testInt = raceRightShiftInterval(shiftInt, nBitsInt)
    if (testInt is not a singleton value interval) {
        modData = {2^{(l2−l3+1)} : 2^{(l2−l3+1)}}
        modInt = raceModuloInterval(shiftInt, modData)
        retList = list of intervals by changing precision of
            modInt to (l2−l3+1) bits
    }
    else {
        retList = list of intervals by changing precision of shiftInt
            to (l2−l3+1) bits
    }
    return retList
}
```

4.7.8.2 Backward Propagation

```
/* result = {o1:o2} */
/* In this case, given the absence of the "x" value in our
representation, we
conservatively return the maxInterval. This problem is mitigated using a
special bit-
slice handling algorithm described in Section 3.6.1.
*/
list raceBackBitSliceInterval(result, numBits, sign) {
    minLow = Minimum value for numBits and sign
    maxHigh = Maximum value for numBits and sign
    maxInterval = {minLow : maxHigh}
    retList = list containing only maxInterval
    return retList
}
```

5. Hardware Environment

Figure 15:
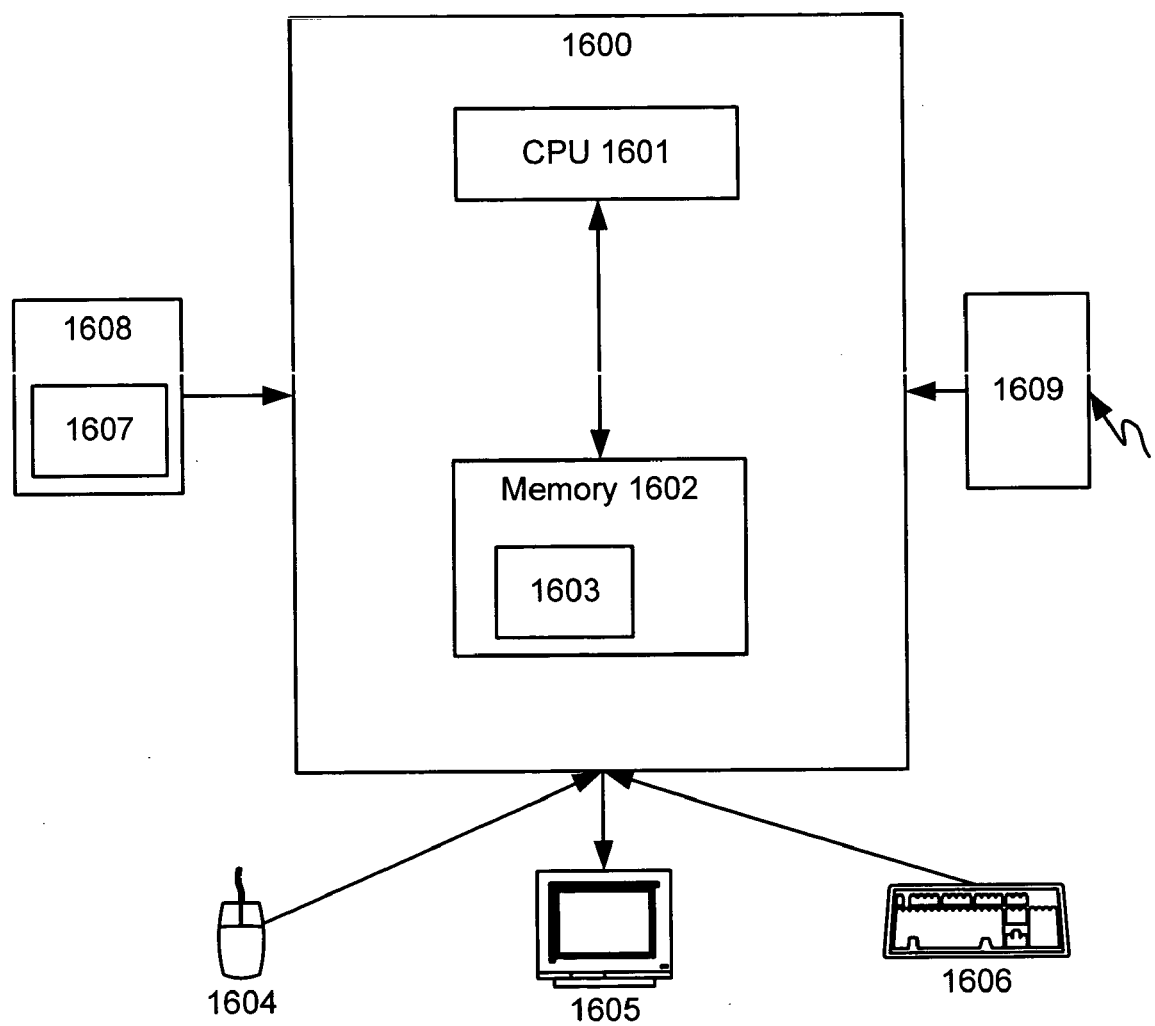
FIG. 15 shows a computing hardware environment within which to operate the present invention.

The constraint set solving architecture of the present invention can be executed within a computing environment (or data processing system) such as that of FIG. 15. FIG. 15 depicts a workstation computer 1600 comprising a Central Processing Unit (CPU) 1601 (or other appropriate processor or processors) and a memory 1602. Memory 1602 has a portion of its memory in which is stored the software tools (or computer programs) and data of the present invention. While memory 1603 is depicted as a single region, those of ordinary skill in the art will appreciate that, in fact, such software may be distributed over several memory regions or several computers. Furthermore, depending upon the computer's memory organization (such as virtual memory), memory 1602 may comprise several types of memory (including cache, random access memory, hard disk and networked file server). Computer 1600 can be equipped with a display monitor 1605, a mouse pointing device 1604 and a keyboard 1606 to provide interactivity between the software of the present invention and the chip designer. Computer 1600 also includes a way of reading computer readable instructions from a computer readable medium 1607, via a medium reader 1608, into the memory 1602. Computer 1600 also includes a way of reading computer readable instructions via the Internet (or other network) through network interface 1609.

In one embodiment, the processes for solving constraints can be implemented within software produced by Synopsys, Inc., of Mountain View, Calif., USA. Examples of such Synopsys software are: OpenVera High Level Verification Language (including its associated electronic design automation software) and VCS HDL Simulator. In some embodiments, computer programs embodying the present invention are stored in a computer readable medium, e.g. CD-ROM or DVD. In other embodiments, the computer programs are embodied in an electromagnetic carrier wave. For example, the electromagnetic carrier wave may include the programs being accessed over a network.

While the invention has been described in conjunction with specific embodiments, it is evident that many alternatives, modifications and variations will be apparent to those skilled in the art in light of the foregoing description. Accordingly, it is intended to embrace all such alternatives, modifications and variations as fall within the spirit and scope of the appended claims and equivalents.

What is claimed is:

1. A computerized method for determining a solution to a set of constraints associated with a circuit design, comprising:
   generating a graph data structure representation for the set of constraints, comprising one or more nodes, each node having an associated range;
   identifying a first plurality of bit-slice constraint nodes, each selecting from a range of bits of a first variable;
   converting the first plurality of bit-slice constraint nodes into a second plurality of bit-slice constraints, wherein none of the bit-slice constraints, of the second plurality of bit-slice constraints, select a range of bits that overlaps with a range of bits selected by any other of the bit-slice constraints;
   generating a value for the first variable that satisfies the second plurality of bit-slice constraints; and
   displaying the value to a circuit designer to facilitate implementing the circuit design.

2. The method of claim 1, wherein the step of converting comprises:
   indicating, in relation to the first variable, two marking bits for each node of the first plurality of bit-slice constraint nodes.

3. The method of claim 2, wherein the step of converting comprises:
   identifying a bit range, of the second plurality of bit-slice constraints, as being denoted by a first marking bit and a second marking bit, wherein a third marking bit is not in-between the first marking bit and the second marking bit.

4. The method of claim 1, wherein the step of generating comprises:
   selecting a value from a range determined for each bit-slice constraint of the second plurality of bit-slice constraints.

5. The method of claim 4, wherein the step of generating comprises:
   concatenating each value selected from the range determined for each bit-slice constraint of the second plurality of bit-slice constraints.

6. A method for evaluating bit-slice nodes in a word-level network, comprising:
   generating a graph data structure representation for a set of constraints associated with a circuit design, comprising one or more nodes, each node having an associated range;
   identifying a first plurality of bit-slice nodes, each selecting from a range of bits of a first operand;
   converting the first plurality of bit-slice nodes into a second plurality of bit-slice selectors, wherein none of the bit-slice selectors, of the second plurality of bit-slice selectors, select a range of bits that overlaps with a range of bits selected by any other of the bit-slice selectors;
   determining a first range of values, for the first operand, that satisfies the second plurality of bit-slice selectors; and
   displaying the first range of values to a circuit designer to facilitate implementing the circuit design.

7. A computer program product comprising:
   a computer usable medium having computer readable code embodied therein for evaluating bit-slice nodes in a word-level network, the computer program product including:
   computer readable program code devices configured to cause a computer to effect generating a graph data structure representation, comprising one or more nodes, each node having an associated range;
   computer readable program code devices configured to cause a computer to effect identifying a first plurality of bit-slice nodes, each selecting from a range of bits of a first operand;
   computer readable program code devices configured to cause a computer to effect converting the first plurality of bit-slice nodes into a second plurality of bit-slice selectors, wherein none of the bit-slice selectors, of the second plurality of bit-slice selectors, select a range of bits that overlaps with a range of bits selected by any other of the bit-slice selectors;
   computer readable program code devices configured to cause a computer to effect determining a first range of values, for the first operand, that satisfies the second plurality of bit-slice selectors.

8. A computer-readable storage medium comprising a computer program, the computer program for evaluating bit-slice nodes in a word-level network, the computer program comprising the following steps when executed by a data processing system:
   generating a graph data structure representation, comprising one or more nodes, each node having an associated range;
   identifying a first plurality of bit-slice nodes, each selecting from a range of bits of a first operand;
   converting the first plurality of bit-slice nodes into a second plurality of bit-slice selectors, wherein none of the bit-slice selectors, of the second plurality of bit-slice selectors, select a range of bits that overlaps with a range of bits selected by any other of the bit-slice selectors;
   determining a first range of values, for the first operand, that satisfies the second plurality of bit-slice selectors.

* * * * *

UNITED STATES PATENT AND TRADEMARK OFFICE
CERTIFICATE OF CORRECTION

| | | |
|---|---|---|
| PATENT NO. | : 7,243,087 B2 | Page 1 of 1 |
| APPLICATION NO. | : 10/666964 | |
| DATED | : July 10, 2007 | |
| INVENTOR(S) | : Mahesh Anantharaman Iyer | |

It is certified that error appears in the above-identified patent and that said Letters Patent is hereby corrected as shown below:

In claim 6 (at column 61, line 53), please delete the phrase, "A method" and replace with the phrase --A computerized method--.

Signed and Sealed this

Twenty-first Day of August, 2007

JON W. DUDAS
*Director of the United States Patent and Trademark Office*